(12) United States Patent
Yoshioka et al.

(10) Patent No.: US 9,291,889 B2
(45) Date of Patent: Mar. 22, 2016

(54) PHOTO MASK AND METHOD FOR FORMING PATTERN USING THE SAME

(71) Applicant: PANASONIC CORPORATION, Osaka (JP)

(72) Inventors: Yoshimasa Yoshioka, Toyama (JP); Akio Misaka, Toyama (JP); Shigeo Irie, Niigata (JP); Hiroshi Sakaue, Kanagawa (JP); Masaru Sasago, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 139 days.

(21) Appl. No.: 14/316,602

(22) Filed: Jun. 26, 2014

(65) Prior Publication Data

US 2014/0308604 A1     Oct. 16, 2014

Related U.S. Application Data

(63) Continuation of application No. PCT/JP2012/007415, filed on Nov. 19, 2012.

(30) Foreign Application Priority Data

Feb. 13, 2012  (JP) ................. 2012-028534

(51) Int. Cl.
| | | |
|---|---|---|
| G03F 1/70 | (2012.01) | |
| G03F 1/38 | (2012.01) | |
| H01L 21/027 | (2006.01) | |
| H01L 21/3213 | (2006.01) | |

(52) U.S. Cl.
CPC .. *G03F 1/38* (2013.01); *G03F 1/70* (2013.01); *H01L 21/0274* (2013.01); *H01L 21/32139* (2013.01)

(58) Field of Classification Search
CPC ........................................................ G03F 1/70
See application file for complete search history.

(56) References Cited

U.S. PATENT DOCUMENTS

| | | | |
|---|---|---|---|
| 5,786,113 | A | 7/1998 | Hashimoto et al. |
| 5,847,421 | A | 12/1998 | Yamaguchi |
| 6,194,252 | B1 | 2/2001 | Yamaguchi |
| 2004/0161678 | A1 | 8/2004 | Misaka |
| 2006/0246362 | A1 | 11/2006 | Yasuzato |
| 2010/0175040 | A1 | 7/2010 | Meiring et al. |
| 2011/0173578 | A1 | 7/2011 | Tsai et al. |
| 2013/0311960 | A1 | 11/2013 | Tsai et al. |

FOREIGN PATENT DOCUMENTS

| | | |
|---|---|---|
| JP | 05-165194 A | 6/1993 |
| JP | 09-073166 A | 3/1997 |
| JP | 2004-272211 A | 9/2004 |

OTHER PUBLICATIONS

International Search Report issued in International Application No. PCT/JP2012/007415 with Date of mailing Jan. 22, 2013, with English Translation.

*Primary Examiner* — Stephen Rosasco
(74) *Attorney, Agent, or Firm* — McDermott Will & Emery LLP

(57) ABSTRACT

An opening width of a main pattern is a width with which a transcription pattern is formed on a target member to be exposed by transmitted exposure light, and is a dimension of 0.8×(λ/NA)×M or less (where λ is a wavelength of the exposure light, and NA and M are a numerical aperture and a reduction ratio of a reduced projection optical system of an exposure apparatus). Each of a first auxiliary pattern adjacent to the main pattern and a second auxiliary pattern located outside the first auxiliary pattern to be adjacent thereto has a width with which a transcription pattern is not formed by the exposure light and generates diffracted light. A first distance between respective centers of the main pattern and the first auxiliary pattern is greater than a second distance between respective centers of the first auxiliary pattern and the second auxiliary pattern.

16 Claims, 15 Drawing Sheets

SA=(s1+s2)/2
=(0.55+0.85)/2=0.7

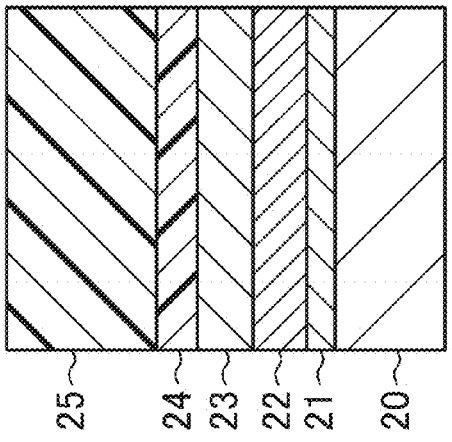
FIG.15C
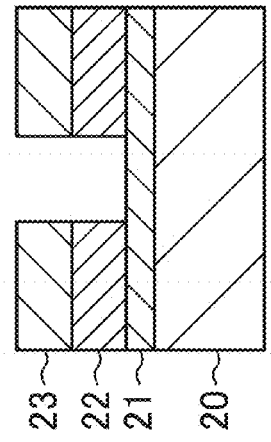
FIG.15F
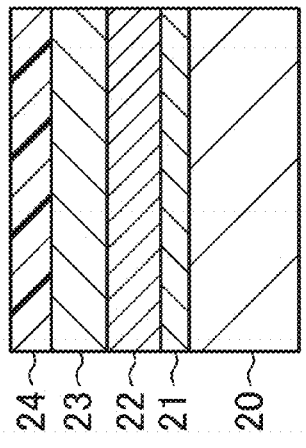
FIG.15B
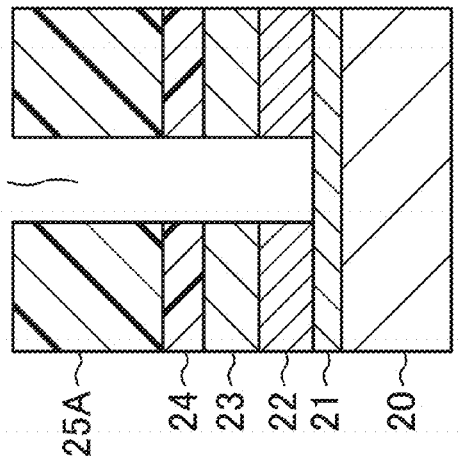
FIG.15E
FIG.15A
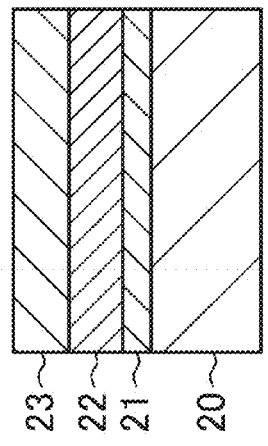
FIG.15D

PHOTO MASK AND METHOD FOR FORMING PATTERN USING THE SAME

CROSS-REFERENCE TO RELATED APPLICATIONS

This is a continuation of International Application No. PCT/JP2012/007415 filed on Nov. 19, 2012, which claims priority to Japanese Patent Application No. 2012-028534 filed on Feb. 13, 2012. The entire disclosures of these applications are incorporated by reference herein.

BACKGROUND

The present disclosure relates to an exposure photo mask used in a projection exposure apparatus and a method for forming a pattern using the same.

In order to improve the performance of semiconductor elements and to reduce a chip area, the degree of integration of semiconductor integrated circuits has been increased. Accordingly, the line width of patterns has been reduced. Therefore, in a lithography process step in which a circuit pattern is formed on a semiconductor substrate, pattern formation with high resolution is required.

Lithography, a resolution pitch RP, and the depth of focus DOF are given by Expression 1 and Expression 2, which are equations called Rayleigh's equations.

$$RP = k1 \cdot \lambda / NA \quad \text{Expression 1}$$

$$DOF = k2 \cdot \lambda / (NA)2 \quad \text{Expression 2}$$

In Expressions 1 and 2, k1 and k2 are called process factor, and are parameters influenced by an exposure wavelength, a resist type, etc. In Expressions 1 and 2, $\lambda$ represents the wavelength of exposure light and NA represents the numerical aperture of an exposure apparatus.

On the basis of Expression 1, in order to attain high resolution, the wavelength $\lambda$ has to be reduced or the numerical aperture NA has to be increased. However, reducing the wavelength requires great change in the process itself, such as the development of a laser device serving as a light source, the development of a resist material that senses light in a wavelength band of the laser device, etc. Thus, a method for achieving high NA is employed in general in order to attain high resolution. However, as understood from Expression 2, increasing NA reduces the depth of focus.

As described above, as a method other than the method in which the wavelength is reduced and the method in which the numerical aperture NA is increased, a technique which enables increase in the resolution, i.e., increase in the contrast of an optical image, and increase in the depth of focus without changing the wavelength $\lambda$ and the numerical aperture NA at the same time has been important.

The most typical technique, among techniques of increasing the contrast and the depth of focus, is a method in which oblique-incidence exposure is performed on a periodic pattern formed on a photo mask. However, in oblique-incidence exposure, substantially effective advantages are achieved only when patterns are provided at short intervals of $\lambda/NA$ or less. Therefore, this method is not effective for reducing the size of arbitrary patterns. As a method for making up for the shortage of oblique-incidence exposure, a method (which will be hereinafter referred to as an "auxiliary pattern method") using an auxiliary pattern may be employed. Note that it is well known that, in the auxiliary pattern method, the focus location of a main pattern and the location where a transcription image is formed are not changed.

The auxiliary pattern method described in Japanese Unexamined Patent Publication No. H05-165194 (which will be hereinafter referred as a first related art example) will be described below. FIG. 16 illustrates a planar configuration of a photo mask used in the first related art example. The photo mask illustrated in FIG. 16 is used, for example, in a exposure apparatus which is capable of performing reduced size projection exposure to reduce the size to one fifth of the original size. As illustrated in FIG. 16, a light shielding film 102 made of chromium (Cr) is attached to a surface of a transparent glass substrate 101 serving as a mask substrate. In the light shielding film 102, an opening portion 103 for a circuit pattern which is a main pattern is formed. Opening portions 104 and 105 for auxiliary patterns are formed at both sides of the opening portion 103 so as to be adjacent to the opening portion 103 for the circuit pattern. In this case, for example, the width of the opening portion 103 is set to 1.5 μm. Each of the respective widths of the opening portions 104 and 105 is set to 0.75 μm. Each of the center distance of each of the opening portion 103 for a circuit pattern and the opening portions 104 and 105 for auxiliary patterns is set to 4.5 μm.

That is, in the photo mask used in the first related art example, auxiliary patterns having a smaller dimension than the dimension of a circuit pattern which is a main pattern are provided at both sides of the main pattern so as to be adjacent to the circuit pattern. However, in the first related art example, although the depth of focus is slightly increased, similar advantages to those of the typical periodic pattern are not achieved.

An improved method of the first related art example, i.e., an auxiliary pattern method described in Japanese Unexamined Patent Publication No. H09-073166 (which will be hereinafter referred to as a second related art example) will be described.

FIG. 17 illustrate a planar configuration of a photo mask used in the second related art example. As illustrated in FIG. 17, a main pattern 202 which is a light shielding portion is provided on a glass substrate 201. Furthermore, a plurality of auxiliary patterns 203 are periodically provided at both sides of the main pattern 202 on the glass substrate 201 at predetermined intervals. The main pattern 202 is formed by a layered film including a low transmittance film as a lower layer and a light shielding film (a chromium film) as an upper layer. Each of the auxiliary patterns 203 is formed by the low transmittance film which is left after the light shielding film as the upper layer has been removed. In this case, the auxiliary pattern 203 formed by the low transmittance film does not form a non-photosensitive portion in a resist film at the time of exposure. Therefore, the depth of focus is increased by periodically providing the auxiliary patterns 203 having a low transmittance, relative to the main pattern 202, and performing oblique-incidence exposure.

SUMMARY

In order to increase the resolution and the depth of focus, it is an effective method to use oblique-incidence exposure. However, in oblique-incidence exposure, for example, perfect periodic patterns are required and the pattern dimension thereof has to be $\lambda/NA$ or less, and like limits are imposed. Therefore, the above-described advantages may not be achieved in all interconnect patterns including an isolated pattern used in typical integrated circuit devices, etc. In such cases, although the depth of focus, etc. is slightly increased by using the auxiliary pattern method according to the first related art example, advantages achieved thereby are only small, as compared to those in the case of perfect periodic patterns.

As in the second related art example, as auxiliary patterns, patterns having a low transmittance are used, thereby increasing the degree of freedom of auxiliary pattern layout. Thus, the periodicity in a pattern layout can be increased. However, also in this case, although the width of auxiliary patterns can be increased, and thus, processing of the auxiliary patterns can be advantageously simplified, the advantage of increasing the resolution and the depth of focus achieved thereby is about the same as that in the first related art example.

It is therefore an object of the present disclosure to solve the above-described problems and realize a photo mask which allows high resolution and greater depth of focus in arbitrary pattern formation.

As a result of various examinations, the present inventors found that increase in resolution, i.e., the advantage of increasing the contrast of light intensity and the advantage of increasing the depth of focus, is not determined depending on whether or not a mask pattern including a main pattern and auxiliary patterns is periodically provided, but is determined depending on whether or not the periodicity of light intensity generated by the mask pattern at exposure is high on a resist film applied to a semiconductor substrate.

In order to achieve the above-described object, a photo mask according to an aspect of the present disclosure includes a transparent substrate which transmits exposure light, a light shielding film formed on the transparent substrate, a first opening portion formed in the light shielding film, a first auxiliary opening portion provided in the light shielding film and located adjacent to the first opening portion, a second auxiliary opening portion provided in the light shielding film and located adjacent to the first auxiliary opening portion at an opposite side to the first opening portion, and a second opening portion provided in the light shielding film and located adjacent to the first opening portion at an opposite side to the first auxiliary opening portion, an opening width of the first opening portion is a width with which a transcription pattern is formed on a target member to be exposed with the transmitted exposure light, and is a dimension of $0.8 \times (\lambda/NA) \times M$ or less (where $\lambda$ is a wavelength of the exposure light, and NA and M are a numerical aperture and a reduction ratio of a reduced projection optical system of an exposure apparatus), each of the first auxiliary opening portion and the second auxiliary opening portion has an opening width with which the transcription pattern is not formed on the target member to be exposed by the transmitted exposure light, and transmits the exposure light to generate diffracted light, and a first distance between a center of the first opening portion and a center of the first auxiliary opening portion is greater than a second distance between the center of the first auxiliary opening portion and a center of the second auxiliary opening portion.

In the photo mask, when the first auxiliary opening portion is located in a proper location relative to the first opening portion, diffracted light that interferes with exposure light transmitted through the first opening portion is generated. Thus, defocus characteristics in a transcription image of the first opening portion which is a main pattern are improved. Also, the second auxiliary opening portion is located in a proper location relative to the first auxiliary opening portion to reduce phase deviation generated by the first auxiliary opening portion. Thus, defocus characteristics in the transcription image of the first opening portion are improved. As a result, the advantage of increasing the depth of focus may be reliably achieved.

In the photo mask, the first distance may be $0.5 \times (\lambda/NA) \times M$ or more and $2.0 \times (\lambda/NA) \times M$ or less (where $\lambda$ is a wavelength of the exposure light, and NA and M are a numerical aperture and a reduction ratio of a reduced projection optical system of an exposure apparatus).

Thus, exposure light transmitted through the first auxiliary opening portion interferes with exposure light transmitted through the first opening portion. Therefore, defocus characteristics in a transcription image are improved, and thus, the depth of focus is increased, i.e., the depth of focus is greater.

In the photo mask, the second distance may be 70 nm×M or more and less than $2.0 \times (\lambda/NA) \times M$ (where $\lambda$ is a wavelength of the exposure light, and NA and M are a numerical aperture and a reduction ratio of a reduced projection optical system of an exposure apparatus). In such a case, on the basis of Expression 1 above, interference of diffracted light can be taken into consideration when $\lambda=193$ nm and NA=1.35 (a practical limit of an exposure apparatus).

Thus, exposure light transmitted through the first auxiliary opening portion, exposure light transmitted through the second auxiliary opening portion, exposure light transmitted through the first opening portion interfere with one another. Therefore, defocus characteristics in a transcription image are improved, and the depth of focus is increased.

In the photo mask, the width of the first auxiliary opening portion may be 0.1 times the width of the first opening portion or more and 0.8 times the width of the first opening potion or less.

Thus, defocus characteristics are improved by interference of diffracted lights generated from exposure light transmitted through the first auxiliary opening portion and exposure light transmitted through the first opening and, as a result, the depth of focus may be increased. In addition, a case where, because light intensity is too high, the resist film which is a target member to be exposed senses light and thus an expected pattern is formed may be avoided.

In the photo mask, the width of the second auxiliary opening portion may be 0.1 times the width of the first opening portion or more and 0.8 times the width of the first opening potion or less.

Thus, defocus characteristics are improved by interference of diffracted lights generated from exposure light transmitted through the second auxiliary opening portion and exposure light transmitted through the first opening portion and, as a result, the depth of focus may be increased. In addition, a case where, because light intensity is too high, the resist film which is a target member to be exposed senses light and thus an expected pattern is formed may be avoided.

In the photo mask, the width of the second auxiliary opening portion may be greater than the width of the first auxiliary opening portion.

Thus, the contrast of light intensity in exposure light transmitted through the second auxiliary opening portion is increased and, as a result, the depth of focus is increased.

In the photo mask, the second distance may be smaller than the first distance by at least 20 nm×M (where M is a reduction ratio of a reduced projection optical system of an exposure apparatus).

Thus, when the first distance is provided at a proper distance, exposure light transmitted through the first auxiliary opening portion and exposure light transmitted through the second auxiliary opening portion interfere with one another, and defocus characteristics in a transcription image are improved. As a result, the advantage of increasing the depth of focus is reliably achieved.

In the photo mask, assuming a predetermined oblique-incidence location SA (where $0.4 \leq SA \leq 0.8$) in exposure in which exposure light is transmitted, the first distance may be $0.5 \times (\lambda/\sin \phi) \times M$ or more and $0.8 \times (\lambda/\sin \phi) \times M$ or less (where $\lambda$ is a wavelength of the exposure light, and NA and M are a numerical aperture and a reduction ratio of a reduced projection optical system of an exposure apparatus) relative to an incidence angle $\phi$ defined by $\sin \phi = NA \times SA$.

Thus, low-order diffracted lights generated from exposure light transmitted through the first opening portion and exposure light transmitted through each of the first auxiliary opening portion and the second auxiliary opening portion due to oblique-incidence exposure interfere with one another. In addition, phase deviation is reduced, and thus, defocus characteristics in a transcription image transcribed through the first opening portion which is a main pattern are improved, resulting in increase in the depth of focus.

In the photo mask, the width of the second auxiliary opening portion may be 1.5 times the width of the first auxiliary opening portion or less.

Thus, film thinning of a resist film which is a target material to be exposed in pattern formation may be reduced. Also, a case where, because light intensity of exposure light transmitted through each of the auxiliary opening portions is too high, the resist film senses light and thus an expected pattern is formed may be avoided. Furthermore, the advantage of increasing the depth of focus by improvement of defocus characteristics in a transcription image may be achieved.

In the photo mask, the second opening portion may serve as a third auxiliary opening portion, the photo mask may further include a fourth auxiliary opening portion provided in the light shielding film and located adjacent to the third auxiliary portion at an opposite side to the first opening portion, a distance between a center of the third auxiliary opening portion and the center of the first opening portion may be equal to the first distance, and a distance between the center of the third auxiliary opening portion and a center of the fourth auxiliary opening portion may be equal to the second distance.

Thus, exposure light transmitted through each of the first auxiliary opening portion, the second auxiliary opening portion, and the third auxiliary opening portion and exposure light transmitted through the first opening portion which is a main pattern interfere with one another. Therefore, defocus characteristics in a transcription image are improved, and the depth of focus is increased.

The photo mask may further include a fifth auxiliary opening portion provided in the light shielding film and located adjacent to the second auxiliary opening portion at an opposite side to the first auxiliary opening portion, the fifth auxiliary opening portion may have an opening width with which a transcription pattern is not formed on the target member to be exposed by the transmitted exposure light and transmit the exposure light to generate diffracted light, and a third distance between the center of the second auxiliary opening portion and a center of a fifth auxiliary opening portion may be smaller than the second distance.

Thus, exposure light transmitted through each of the first auxiliary opening portion, the second auxiliary opening portion, and the fifth auxiliary opening portion and exposure light transmitted through the first opening portion which is a main pattern interfere with one another. Therefore, defocus characteristics in a transcription image are improved, and the depth of focus is increased.

In this case, the third distance may be 70 nm×M or more and less than $2.0 \times (\lambda/NA) \times M$ (where $\lambda$ is a wavelength of the exposure light, and NA and M are a numerical aperture and a reduction ratio of a reduced projection optical system of an exposure apparatus). In such a case, on the basis of Expression 1 above, interference of diffracted light can be taken into consideration when $\lambda = 193$ nm and $NA = 1.35$ (a practical limit of an exposure apparatus).

Thus, exposure light transmitted through the second auxiliary opening portion, exposure light transmitted through the third auxiliary opening portion, and exposure light transmitted through the first opening portion interfere with one another. Therefore, defocus characteristics in a transcription image are improved, and the depth of focus is increased.

In the photo mask, at least one of the first auxiliary opening portion and the second auxiliary opening portion may be divided into a plurality of segmented portions.

In this case, at least one of the third auxiliary opening portion and the fourth auxiliary opening portion may be divided into a plurality of segmented portions.

In the photo mask, the width of the first auxiliary opening portion and the width of the second auxiliary opening portion may be equal to one another.

A method for forming a pattern according to another aspect of the present disclosure is directed to a method for forming a pattern using a photo mask according to an aspect of the present disclosure, and the method includes forming a resist film on a substrate, irradiating the resist film with the exposure light via the photo mask, and developing the resist film which has been irradiated with the exposure light to form a resist pattern.

According to the method for forming a pattern, the advantages of oblique-incidence illumination are achieved and thus the contrast of the light intensity of a transcription image is increased, so that defocus characteristics are advantageously improved. That is, formation of a fine pattern with excellent defocus characteristics is enabled. Note that the method for forming a pattern according to the present disclosure is particularly effective when the average value of the outer diameter and inside diameter in an illumination shape used for an annular illumination is 0.4 or more and 0.8 or less.

Using a photo mask according to an aspect of the present disclosure and a method for forming a pattern using the photo mask, in forming an arbitrary pattern, the resolution of the pattern and the depth of focus thereof may be increased.

BRIEF DESCRIPTION OF THE DRAWINGS

FIGS. 15A-15F are cross-sectional views illustrating example process steps of a method for forming a pattern using a photo mask according to the present disclosure and a method for fabricating a semiconductor device in the order of the process steps.

DETAILED DESCRIPTION

The following are premises assumed for describing embodiments.

Normally, a photo mask is used in a reduced projection type exposure apparatus, and therefore, when a pattern dimension on a mask is discussed, a reduction ratio has to be taken into consideration.

However, in describing each of the following embodiments, when a pattern dimension on a mask is described in accordance with a desired pattern (e.g., a resist pattern) that is to be formed, for the sake of avoiding confusion, values into which a mask dimension is converted at the reduction ratio are used unless specifically mentioned otherwise. Specifically, it is assumed that, in a 1/M reduced projection system, when a resist pattern having a width of 100 nm is formed using a mask pattern having a width of M×100 nm, each of the respective widths of the mask pattern and the resist pattern is 100 nm.

First Embodiment

A photo mask according to a first embodiment will be described with reference to the accompanying drawings.

Figure 1A:
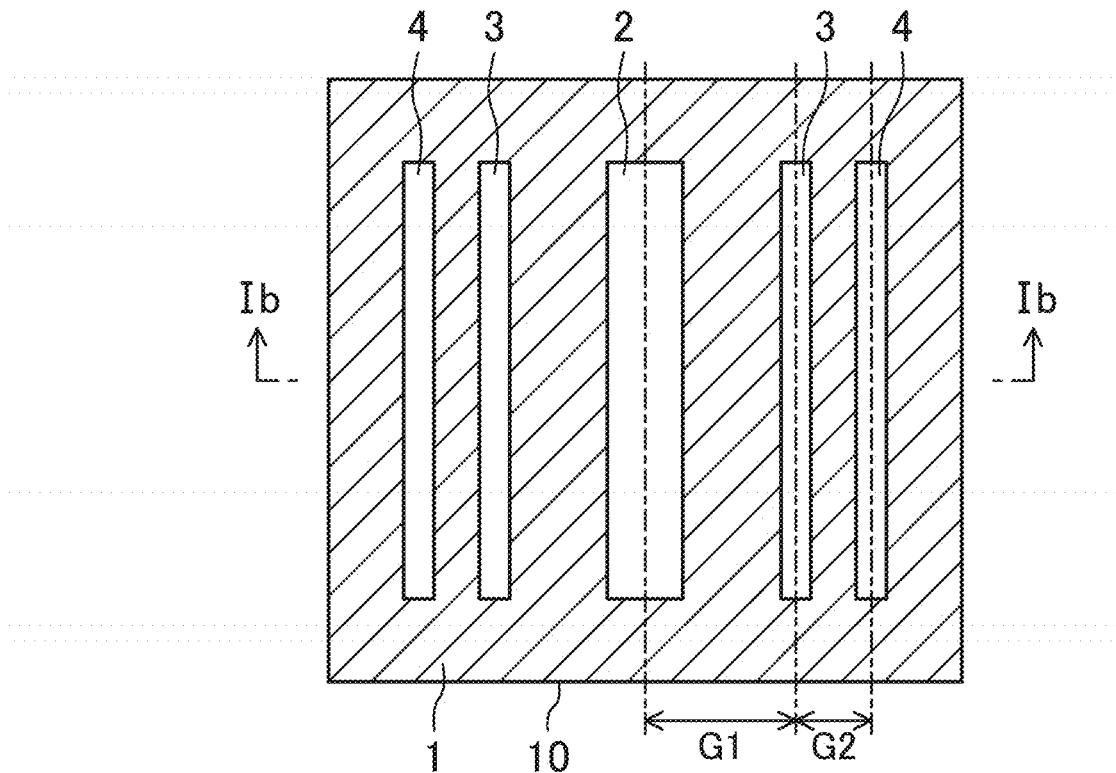
FIG. 1A is a plane view illustrating a photo mask according to a first embodiment and FIG. 1B is a cross-sectional view taken along the line Ib-Ib of FIG. 1A.
Figure 1B:
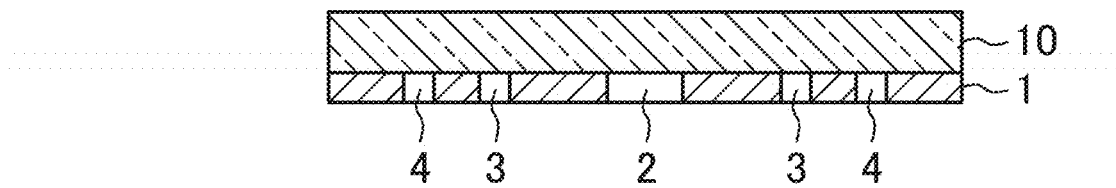

FIG. 1A illustrates a planar configuration of a photo mask according to the first embodiment. FIG. 1B illustrates a cross-sectional configuration taken along the line Ib-Ib of FIG. 1A. A case where a resist material that is a target member to be exposed with exposure light transmitted through the photo mask is a positive resist will be described below.

As illustrated in FIG. 1A and FIG. 1B, a light shielding film 1 made of, for example, chromium (Cr) is formed in a glass substrate 10 which serves as a substrate of a photo mask. The light shielding film 1 is selectively removed, and a circuit pattern, i.e., a main pattern 2 which is a line shape isolated opening portion, is formed.

The width of the main pattern 2 which is an isolated opening portion formed in the photo mask has a dimension of $0.8 \times (\lambda/NA) \times M$ or less. In this case, $\lambda$ is a wavelength of exposure light, and NA and M are a numerical aperture and a reduction ratio of a reduced projection optical system of an exposure apparatus. The same applies hereinafter. Auxiliary patterns 3 and second auxiliary patterns 4 which are auxiliary opening portions each being located so as to extend in parallel to the main pattern 2 are provided in parts of the light shielding film 1 located at both sides of the main pattern 2.

Each of the respective widths of the first auxiliary patterns 3 and the second auxiliary patterns 4 is smaller than the width of the main pattern 2. A distance G1 between the center line of the main pattern 2 and the center line of each of the first auxiliary patterns 3 is greater than a distance G2 between the center line of the first auxiliary pattern 3 and the center line of a corresponding one of the second auxiliary patterns 4.

The distances G1 at both sides of the main pattern 2 are equal to one another. The first auxiliary patterns 3 and the second auxiliary patterns 4 are provided at locations which allow the distances G2 at the both sides of the main pattern 2 to be equal to one another. In other words, the first auxiliary patterns 3 and the second auxiliary patterns 4 are provided at locations symmetrical to one another about the center line of the main pattern 2 serving as a symmetrical axis and are symmetrically shaped.

According to the first embodiment, an opening pattern including the main pattern 2, the first auxiliary patterns 3, and the second auxiliary patterns 4 is formed in the photo mask. Thus, each of the auxiliary patterns 3 and 4 is located in a proper location, so that exposure light transmitted through the opening portion of the main pattern 2 and exposure light transmitted through each of the opening portions of the first auxiliary patterns 3 and the second auxiliary patterns 4 interfere with one another. In order to improve defocus characteristics, it is important to cause interference of low-order diffracted light and to cause the phases of a transcription image to match.

That is, when the distance G1 between the center line of the main pattern 2 and the center line of each of the first auxiliary patterns 3 is greater than the distance G2 between center line of the first auxiliary pattern 3 and the center line of an corresponding one of the second auxiliary patterns 4, exposure light transmitted through the main pattern 2 and exposure light transmitted through the first auxiliary pattern 3 interfere with one another. Thus, the contrast of a transcription image is improved, and defocus characteristics are improved. In addition, the respective phases of the exposure light transmitted through the main pattern 2 and the exposure light transmitted through the first auxiliary pattern 3 are caused to match one another by the second auxiliary pattern 4 and, furthermore, defocus characteristics are improved. As a result, the depth of focus is increased.

Figure 2:
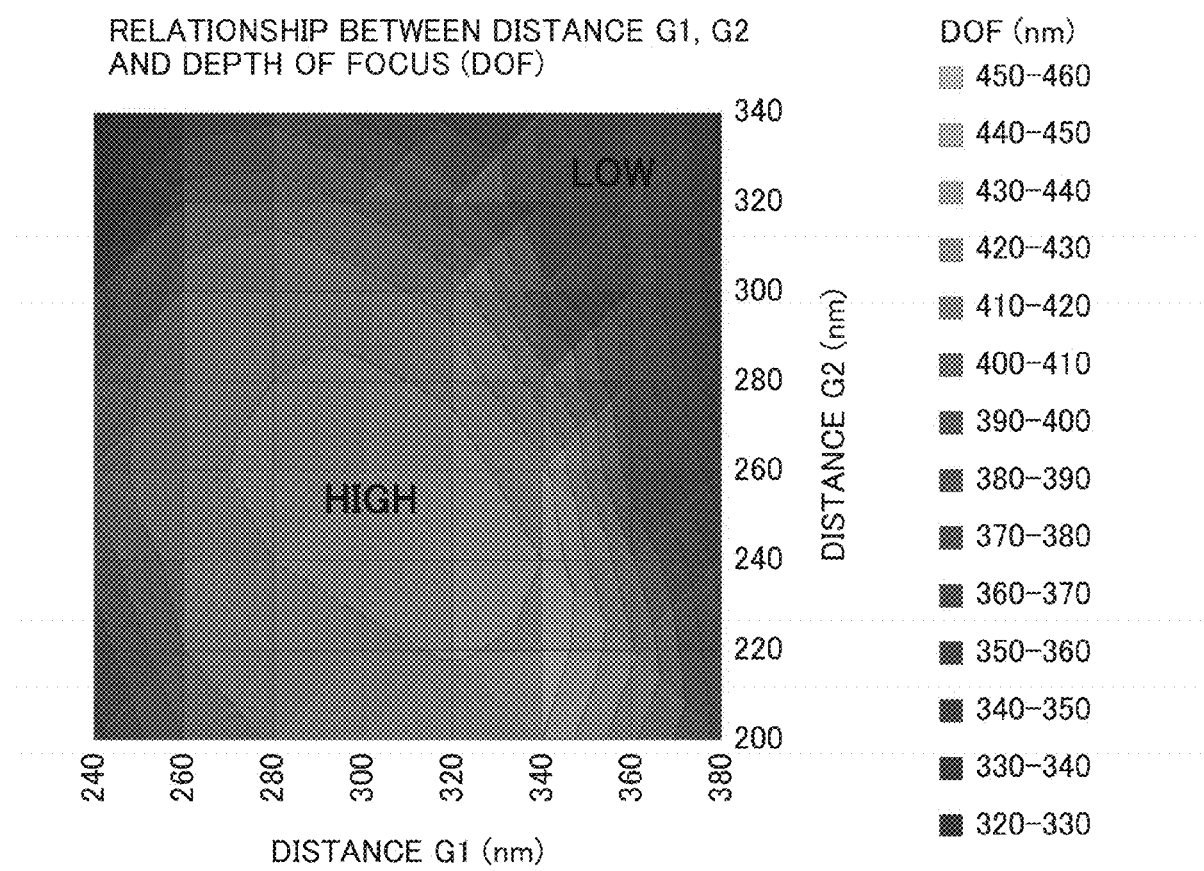
FIG. 2 is a graph illustrating a simulation result obtained when a distance G1 between the center line of a main pattern and the center line of a first auxiliary pattern and a distance G2 between the center line of the first auxiliary pattern and the center line of a second auxiliary pattern are changed.

FIG. 2 illustrates a simulation result obtained when the distance G1 between the center line of the main pattern 2 and the center line of each of the first auxiliary patterns 3 and the distance G2 between the center line of the first auxiliary pattern 3 and the center line of an corresponding one of the second auxiliary pattern 4 are changed. In this case, assuming that the width of a target transcription line is 120 nm, the depth of focus when the line width fluctuates by ±10% is calculated. The condition of the simulation is that oblique-incidence exposure (an annular illumination) is used, NA=0.7, SA=0.7, and λ=248 nm. The width of the main pattern 2 which is a line shape isolated pattern is a target dimension×M and the value of M=4 is used. Each of the respective widths of the first auxiliary patterns 3 and the second auxiliary patterns 4 is 84 nm.

Note that the locations of the auxiliary patterns 3 and 4 are not dependent on the pattern widths thereof. This is because increase in the depth of focus achieved by the auxiliary patterns 3 and 4 is caused by interference of low-order diffracted light and matching of the phases in a transcription image. That is, as illustrated in Expression 1 and Expression 2 above, the locations of the auxiliary patterns 3 and 4 are not dependent on the widths of auxiliary patterns.

As illustrated in FIG. 2, it is understood that, in order to maximize the depth of focus, when the distance G1 between the center line of the main pattern 2 and the center line of each of the first auxiliary patterns 3 in FIG. 1 is properly located, the distance G1 is greater than the distance G2 between the center line of the first auxiliary pattern 3 and the center line of a corresponding one of the second auxiliary patterns 4.

For example, in the case where the distance G1 is 280 nm, if the distance G2 is smaller than the distance G1 only by 20 nm, exposure light transmitted through the main pattern 2 and the exposure light transmitted through each of the auxiliary patterns 3 and 4 interfere with one another and the phases match. As a result, defocus characteristic are improved. In the case where the distance G1 is 300 nm, if the distance G2 is smaller than the distance G1 by only 40 nm, the exposure light transmitted through the main pattern 2 and the exposure light transmitted through each of the auxiliary patterns 3 and 4 interfere with one another and the phases match. As a result, defocus characteristics are improved.

As described above, the distance G2 between the center line of each of the first auxiliary patterns 3 and the center line of a corresponding one of the second auxiliary patterns 4 is preferably smaller than the distance G1 between the center line of the main pattern 2 and the center line of the first auxiliary pattern 3 which are properly located only by at least 20 nm. Note that, as described above, when a 1/M reduced projection system is used, the distance G2 is smaller than the distance G1 only by at least 20 nm×M.

In oblique-incidence exposure, as the condition for forming an image by diffracted light, Expression 1 is modified, and the resolution pitch RP is given as expressed by Expression 3 and Expression 4.

$$RP = k1 \cdot \lambda / NA \times SA) \quad \text{Expression 3}$$

$$RP = k1 \cdot \lambda / \sin \phi \quad \text{Expression 4}$$

In this case, λ is a wavelength of exposure light, NA is a numerical aperture of a reduced projection optical system of an exposure apparatus, and SA is an oblique-incidence location of oblique-incidence illumination. Also, sin φ is an incidence angle defined by NA×SA, and k1 is called process factor and is a parameter influenced by the wavelength of exposure light, the resist type, etc. The same applies hereinafter.

The oblique-incidence location SA is preferably 0.4≤SA·0.8. When SA is reduced, the effect of oblique-incidence exposure is reduced. For example, when SA=0, there is no difference from normal illumination. When SA is too large, the dependency on the resolution pitch is increased, and thus, flexibility of oblique-incidence exposure is lost.

A possible value of the process factor k1 is 0.5 or more on the basis of optical limitation. That is, in order to cause exposure light transmitted through the main pattern 2 and exposure light transmitted through each of the first auxiliary patterns 3 to interfere with one another, the value of the distance G1 between the center line of the main pattern 2 and the center line of the first auxiliary pattern 3 has to be 0.5× (λ/NA)×M or more, on the basis of Expression 1. Note that the distance G1 is preferably 2.0×(λ/NA)×M or less. Thus, interference of diffracted light may be reliably caused to occur and, in addition, deterioration of defocus characteristics caused by interference of high-order diffracted light due to increase in the resolution pitch may be reduced.

On the basis of Expression 4, in oblique-incidence exposure, in order to cause exposure light transmitted through the main pattern 2 and exposure light transmitted through each of the first auxiliary patterns 3 to interfere with one another, the distance G1 between the center line of the main pattern 2 and the center line of the first auxiliary pattern 3 has to be 0.5× (λ/sin φ)×M or more. Furthermore, the distance G1 is preferably 2.0×(λ/sin φ)×M or less, and is more preferably 0.8×(λ/sin φ)×M or less.

Thus, interference of diffracted light may be reliably caused to occur and, in addition, deterioration of defocus characteristics caused by interference of high-order diffracted light due to increase in the resolution pitch may be reduced. Furthermore, the incidence angle of zero-order light and first-order light and the incidence angle of zero-order light and negative first-order light may be set values which are close to one another, and thus, deterioration of defocus characteristics due to angle deviation may be reduced.

Figure 3A:
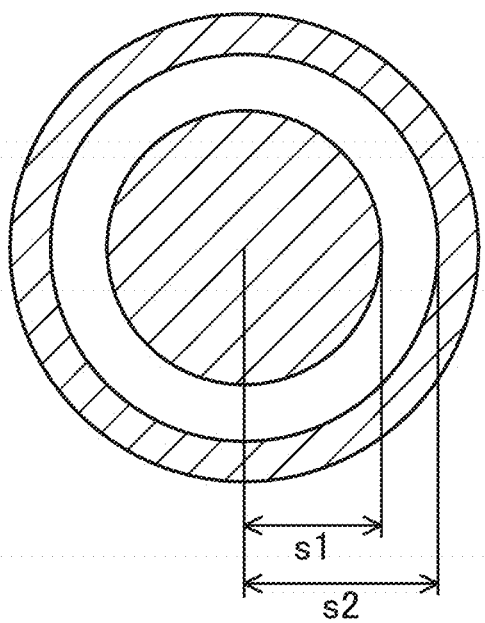
FIG. 3A is a plane view illustrating an oblique-incidence location when a specific simulation of the depth of focus (DOF) characteristics is performed.
Figure 3B:
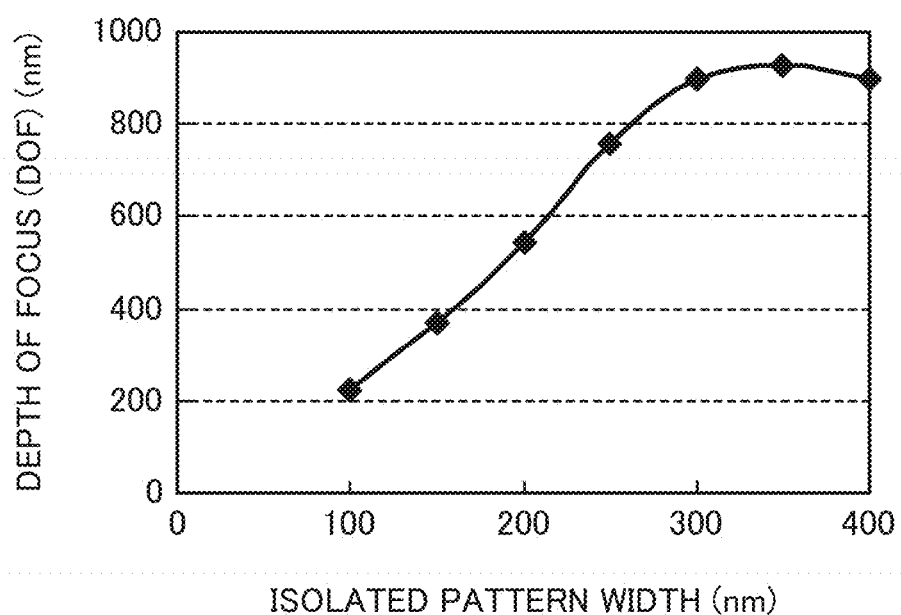
FIG. 3B is a graph illustrating the depth of focus (DOF) characteristics by a simulation in oblique-incidence exposure.

FIG. 3A and FIG. 3B illustrate the depth of focus (DOF) characteristics in oblique-incidence exposure. FIG. 3A illustrates an oblique-incidence location used in a simulation. FIG. 3B illustrates behavior when a dimension of an isolated pattern in oblique-incidence exposure is changed. The condition of the simulation is that oblique-incidence exposure (an annular illumination) is used, NA=0.55, SA=0.7, and λ=248 nm. The width of the main pattern 2 which is a line shape isolated pattern is a target dimension×M and the value of M=4 is used. A transcription target width in the main pattern 2 is a mask target×1/M. The main pattern 2 has a structure in which a light shielding film is stacked on a transparent substrate and opening portions are patterned in the stacked shielding film.

It is understood from the FIG. 3B that, as the width of an isolated pattern reduces, the depth of focus reduces. According to this simulation, around the point where the pattern width is 0.8×248/0.55=360 nm, the depth of focus is maximum, and with a finer line width, the depth of focus drastically reduces. On the basis of the forgoing, it is very useful to increase the depth of focus by applying the present disclosure to a pattern having a width of 0.8×(λ/NA)×M or less.

Figure 4:
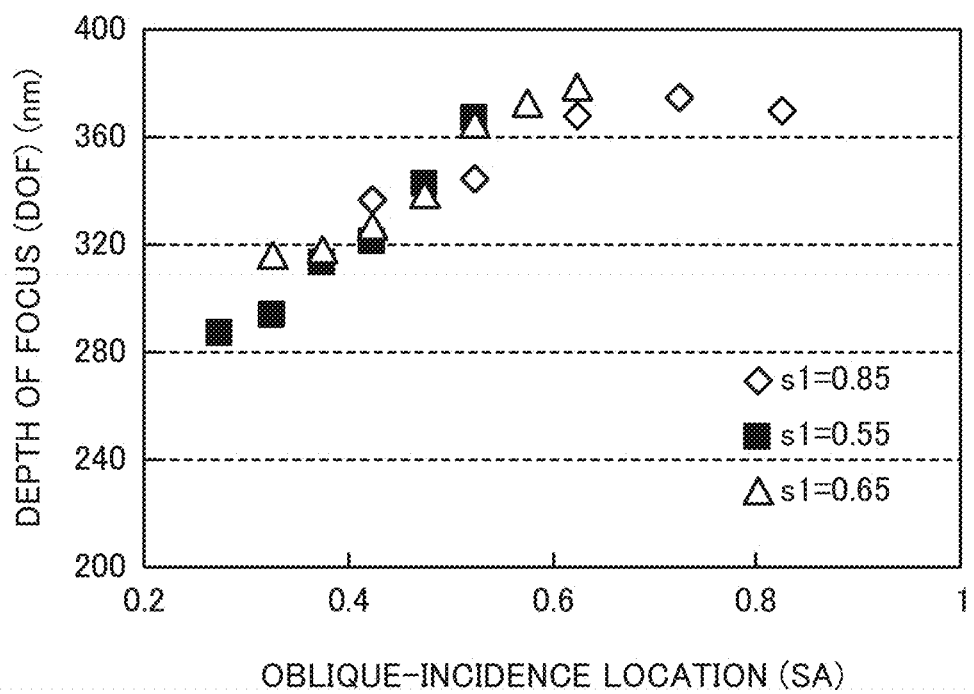
FIG. 4 is a graph illustrating the relationship between the depth of focus (DOF) in an isolated pattern using an auxiliary pattern method and the oblique-incidence location (SA).

FIG. 4 illustrates the relationship between the depth of focus and the oblique-incidence location SA in an isolated pattern using an auxiliary pattern method. The condition of the simulation is that oblique-incidence exposure (an annular illumination) is used, NA=0.55 and λ=248 nm. The width of the main pattern 2 which is a line shape isolated pattern is 120 nm×M. The first auxiliary patterns 3 each having a center line in a corresponding one of locations at both sides of the center line of the main pattern 2 at an interval of 300 nm from the center line are provided. Also, the second auxiliary patterns 4 each having a center line in a corresponding one of locations outside the center lines of the first auxiliary patterns 3 at an interval of 300 nm. Each of the auxiliary patterns 3 and 4 has a width of 80 nm and a value of M=4 is used. The transcription target of the main pattern 2 is 120 nm. Each of the main pattern 2 and the auxiliary patterns 3 and 4 has a structure in which a light shielding film is stacked on a transparent substrate and opening portions are patterned in the stacked light shielding film. The reference character s1 in FIG. 4 is the same as s1 in FIG. 3A.

In this case, as the oblique-incidence location SA reduces, the effect of an annular illumination reduces and, because of this, defocus characteristics in a transcription image are deteriorated and, as a result, the depth of focus is reduced, i.e., the depth of focus becomes shallow. When the oblique-incidence location SA is smaller than 0.4, the depth of focus is reduced by as much as about 15% from the maximum value, and therefore, the oblique-incidence location SA is preferably 0.4 or more. When the value of oblique-incidence location SA is greater than 0.8, the dependency on the resolution pitch increases, as FIG. 4 illustrates that the depth of focus starts reducing. Thus, flexibility for the resolution pitch is lost, and therefore, the value of the oblique-incidence location SA is preferably 0.8 or less.

Figure 5:
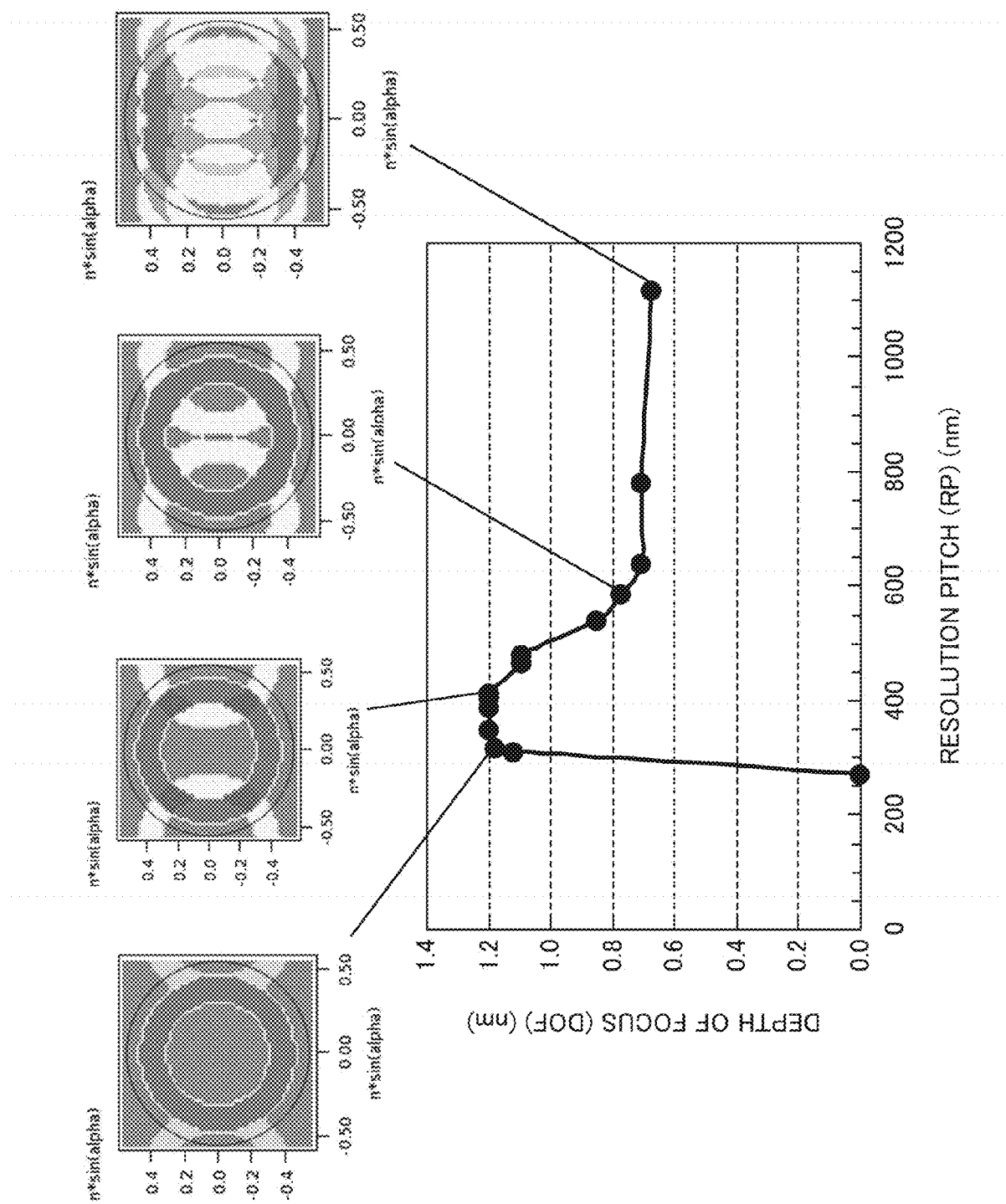
FIG. 5 is a graph illustrating behavior when the resolution pitch (RP) of a periodic line pattern in oblique-incidence exposure is changed and corresponding two-dimensional pupil filling.

FIG. 5 illustrates behavior when the resolution pitch of a periodic line pattern in oblique-incidence exposure is changed and the corresponding two-dimensional pupil filling. The term "pupil filling" herein means the energy distribution around an angle range in oblique-incidence exposure (an annular illumination). The condition of the simulation is that the annular illumination is used, NA=0.55, SA=0.7, and λ=248 nm. The width of the periodic line pattern is 250 nm×M and the value of M=4 is used. A transcription target dimension in the periodic line pattern is 200 nm. Note that the periodic line pattern has a structure in which a light shielding film is stacked on a transparent substrate and opening portions are patterned in the stacked shielding film.

As illustrated in FIG. 5, when the value of the resolution pitch=0.5×λ/sin φ is less than 320 nm, interference is not caused by diffracted light. Thus, a pattern is not transcribed onto the resist film. When the value of the resolution pitch is 320 nm or more, interference is caused by diffracted light, and the depth of focus drastically rises.

Referring to FIG. 5, it is understood from the pupil filling that, in the case where an annular illumination is used, as the value of the resolution pitch increases, the phase of light deviates. The phase deviation deteriorates defocus characteristics. On the other hand, reduction of the resolution pitch has the effect of reducing the diffraction angle in diffracted light, thus improving defocus characteristics. Because of the phase deviation and the diffraction angle reduction effect, the depth of focus is maintained high.

As the resolution pitch is further increased, the depth of focus is reduced. The diffraction angle is determined by the diffraction order×λ/the resolution pitch. That is, since the diffraction angle is inversely proportional to the resolution pitch, the advantage of improving defocus characteristics due to reduction in diffraction angle is smaller when the resolution pitch is great, as compared to when the resolution pitch is small. In addition, high-order diffracted light is added, and thus, the value of the depth of focus is reduced.

As described above, on the based on the results illustrated in FIG. 5, the value of the depth of focus is reduced by 10% from the peak value when the resolution pitch is around 1.5 times the resolution pitch of an imaging limit. As for the resolution pitch, in view of Expression 1, k1 corresponds to a value of approximately 0.8.

Therefore, in order to maximize the advantage of increasing the depth of focus achieved by the first auxiliary pattern 3, $0.5 \cdot \lambda/(\sin \phi) \leq G1 \leq 0.8 \cdot \lambda/(\sin \phi)$ may be satisfied.

Also, not only the defocus characteristics of the main pattern 2 relative to the first auxiliary patterns 3 are improved by the second auxiliary patterns 4, but also, the contrast of the light intensity distribution of the first auxiliary patterns 3 may be increased to improve the defocus characteristics, thereby increasing the advantage of increasing the depth of focus.

As illustrated in FIG. 2, when the distance G1 between the center line of the main pattern 2 and the center line of each of the first auxiliary patterns 3 is greater than the distance G2 between the center line of the first auxiliary pattern 3 and the center line of a corresponding one of the second auxiliary pattern 4, the phases of light match and a strong contrast may be obtained. Thus, the depth of focus is maximized. However, in order to maximize the depth of focus, the distance G1 has to be greater than ½ times the sum of the width of the first auxiliary patterns 3 and the width of the second auxiliary patterns 4.

When the distance G1 is ½ times the sum of the width of the first auxiliary patterns 3 and the width of the second auxiliary patterns 4 or less, the contrast is reduced by interference between the first auxiliary pattern 3 and the second auxiliary pattern 4 and thus defocus characteristics are reduced. Also, the light intensity is too high, and thus, the auxiliary patterns 3 and 4 are transcribed onto the resist film.

In the first embodiment, each of the width of the first auxiliary patterns 3 and the width of the second auxiliary patterns 4 is preferably 0.1 times the width of the main pattern 2 or more and 0.8 times the width of the main pattern 2 or less.

If the widths of the auxiliary patterns 3 and 4 are large, a greater influence of the auxiliary patterns 3 and 4 is given to the main pattern 2. Thus, needless to say, defocus characteristics are improved and, as a result, the depth of focus is increased. However, the widths of the auxiliary patterns 3 and 4 are too large, the auxiliary patterns 3 and 4 are undesiredly transcribed onto the resist film.

Figure 6:
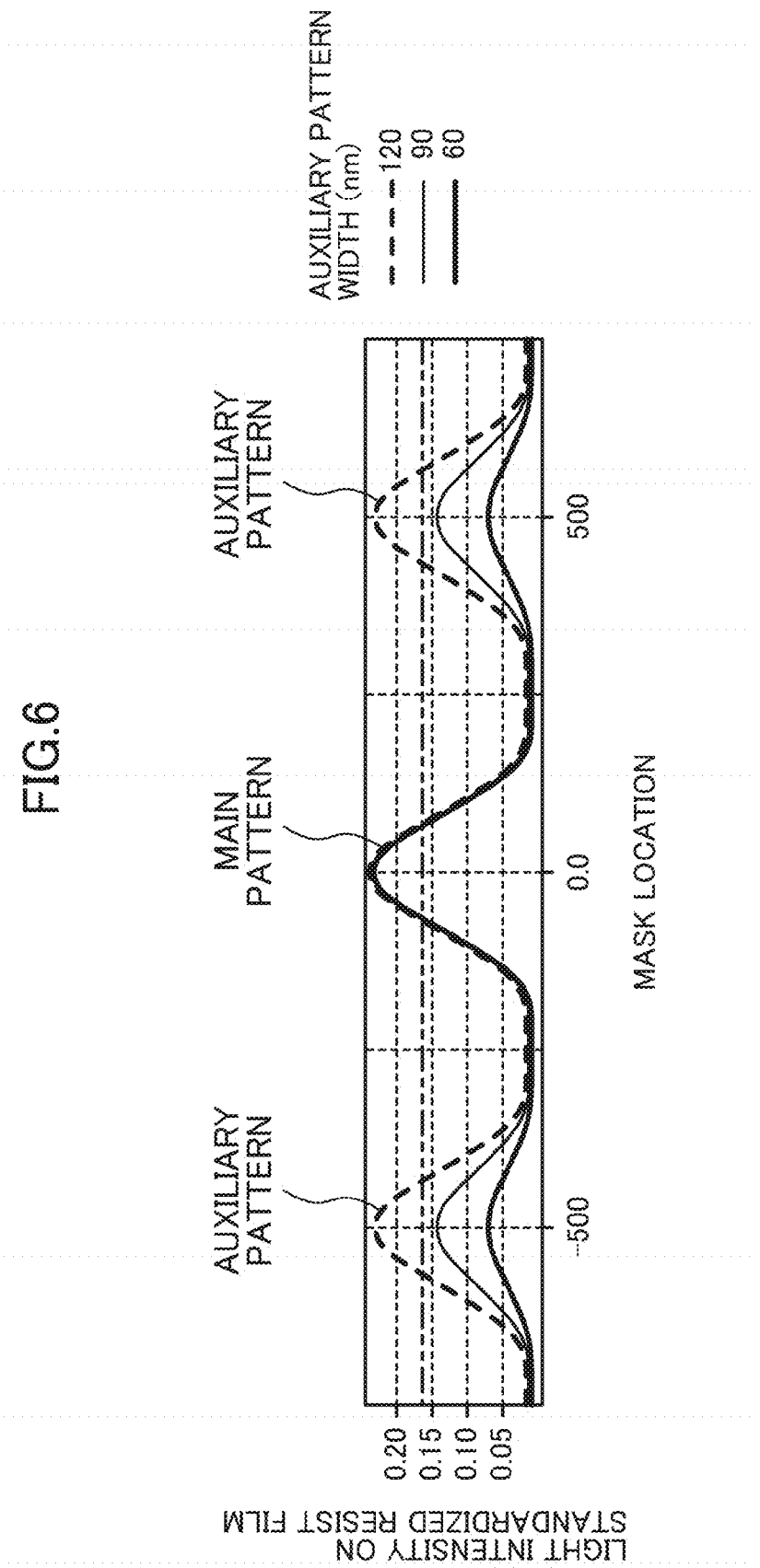
FIG. 6 is a graph illustrating light intensity on a wafer when the width of auxiliary patterns is changed.

FIG. 6 illustrates light intensity on a wafer when the widths of auxiliary patterns are changed. The condition of the simulation is that oblique-incidence exposure (an annular illumination) is used, NA=0.7, SA=0.7, and λ=248 nm. The width of the main pattern which is an isolated pattern is 120 nm×M and a value of M=4 is used. The distance between the center line of the main pattern and the center line of the first auxiliary pattern is 500 nm. The width of a transcription target is 120 nm, and it is defined that the auxiliary patterns have been transcribed onto a resist, when auxiliary patterns are transcribed onto a resist in a region in which the width of a region of the main pattern which has been transcribed is 102 nm to 138 nm, i.e., a region in which the transcription target is 120 nm±15%.

In FIG. 6, when the light intensity of the auxiliary patterns has reached approximately 0.16 represented by the alternate long and two short dashes line, it is defined that the auxiliary patterns are transcribed onto the resist film. Note that each of the main pattern and the auxiliary patterns has a structure in which a light shielding film is stacked on a transparent substrate and opening portions are patterned in the stacked light shielding film.

In this case, when the width of the auxiliary patterns is 120 nm, the auxiliary patterns are transcribed onto the resist film because exposure light transmitted through the opening portions is too large. On the other hand, when the width of the auxiliary patterns is 90 nm or less, that is, when the width of the auxiliary patterns is 0.8 times the width of the main pattern or less, i.e., 96 nm or less, exposure light transmitted through the opening portions of the auxiliary patterns is sufficiently reduced. Therefore, the auxiliary patterns are not transcribed onto the resist film, and the advantage of increasing the depth of focus may be achieved.

As has been described above, in the first embodiment, the auxiliary patterns 3 and 4 are provided in a region around the main pattern 2 such that the interval between the main pattern 2 and each of the auxiliary patterns 3 and 4, the interval between the auxiliary patterns, and the dimensions of the auxiliary patterns 3 and 4 are adjusted. Thus, in the isolated space which is a main pattern, or an end portion of the periodic space, excellent periodicity of light intensity may be achieved in a resist film formed on a semiconductor substrate. As a result, the resolution and the depth of focus may be greatly increased.

Figure 7:
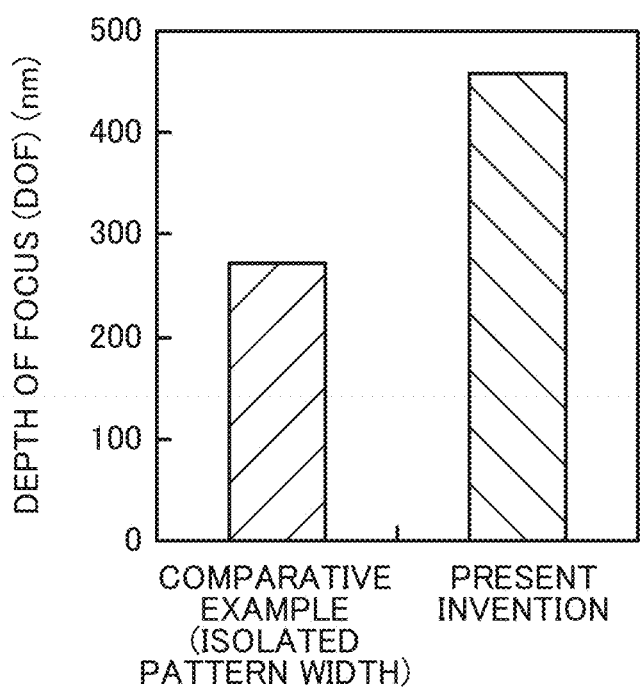
FIG. 7 is a graph illustrating the advantage of increasing the depth of focus (DOF) achieved by a photo mask according to a first embodiment with a comparative example.

FIG. 7 illustrates simulation results for the depth of focus of a mask pattern according to the first embodiment and the depth of focus of an isolated pattern as a comparative example. In this case, a target transcription line width is 120 nm. The condition of the simulation is that oblique-incidence exposure (an annular illumination) is used, NA=0.7, SA=0.7, and λ=248 nm. The width of the isolated pattern is a target dimension×M and the value of M=4 is used. The width of a transcription target is a mask target×1/M.

The distance G1 between the center line of the main pattern 2 and the center line of each of the first auxiliary patterns 3 is 300 nm, the distance G2 between the center line of the first auxiliary pattern 3 and the center line of a corresponding one of the second auxiliary patterns 4 is 260 nm, and each of the respective widths of the first auxiliary patterns 3 and the second auxiliary patterns 4 is 84 nm. Each of the isolated pattern according to the comparative example, and the main pattern 2 and the auxiliary patterns 3 and 4 according to this embodiment has a structure in which a light shielding film is stacked on a transparent substrate and opening portions are patterned in the stacked light shielding film.

As illustrated in FIG. 7, in this embodiment, the depth of focus has been increased by 70%, and thus, the embodiment is very useful.

First Modified Example of First Embodiment

A first modified example of the first embodiment will be described below with reference to FIG. 8.

Figure 8:
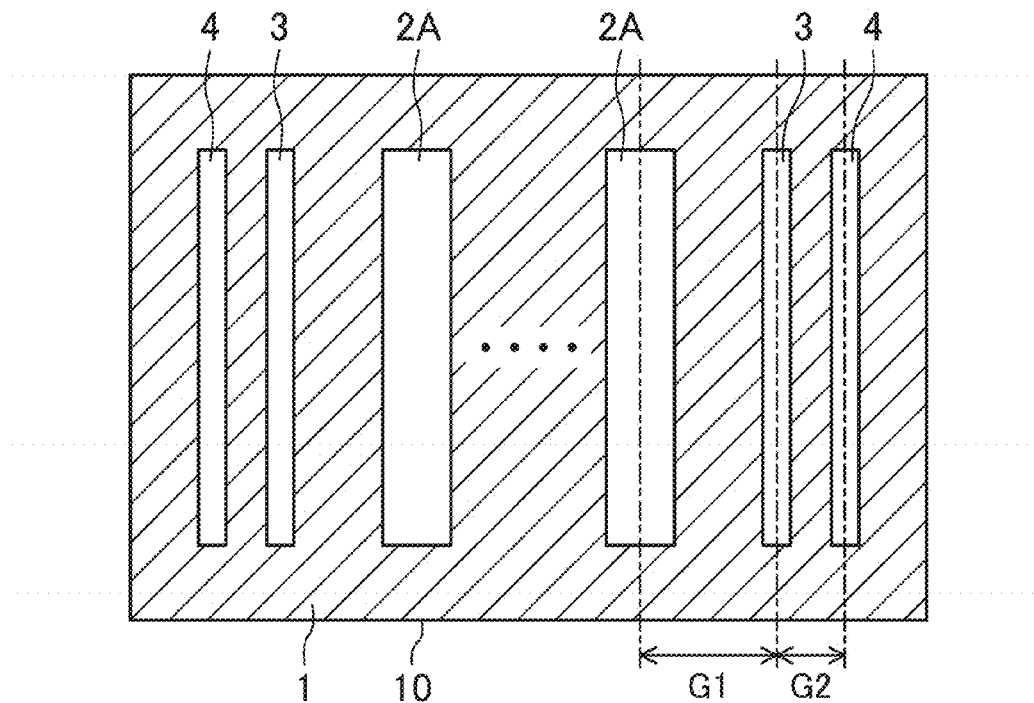
FIG. 8 is a plane view illustrating a photo mask according to a first modified example of the first embodiment.

As illustrated in FIG. 8, a photo mask according to the first modified example includes a plurality of main patterns 2A periodically provided at predetermined intervals and first auxiliary patterns 3 and second auxiliary patterns 4 provided outside both sides of the plurality of main patterns 2A so as to extend in parallel to the main patterns 2A.

The center line of each of the first auxiliary patterns 3 is located at a distance G1 from the center line of a corresponding one of the main patterns 2A and the center line of a corresponding one of the second auxiliary patterns 4 is located at a distance G2 from the center line of the first auxiliary pattern 3. The distance G1 is greater than the distance G2.

As described above, it is clear that, even when the plurality of main patterns 2A are periodically provided, the auxiliary patterns 3 and 4 are provided in regions at both sides of a group of the main patterns, and thereby, the advantages of the present disclosure may be achieved.

Second Modified Example of First Embodiment

A second modified example of the first embodiment will be described below with reference to FIG. 9.

Figure 9:
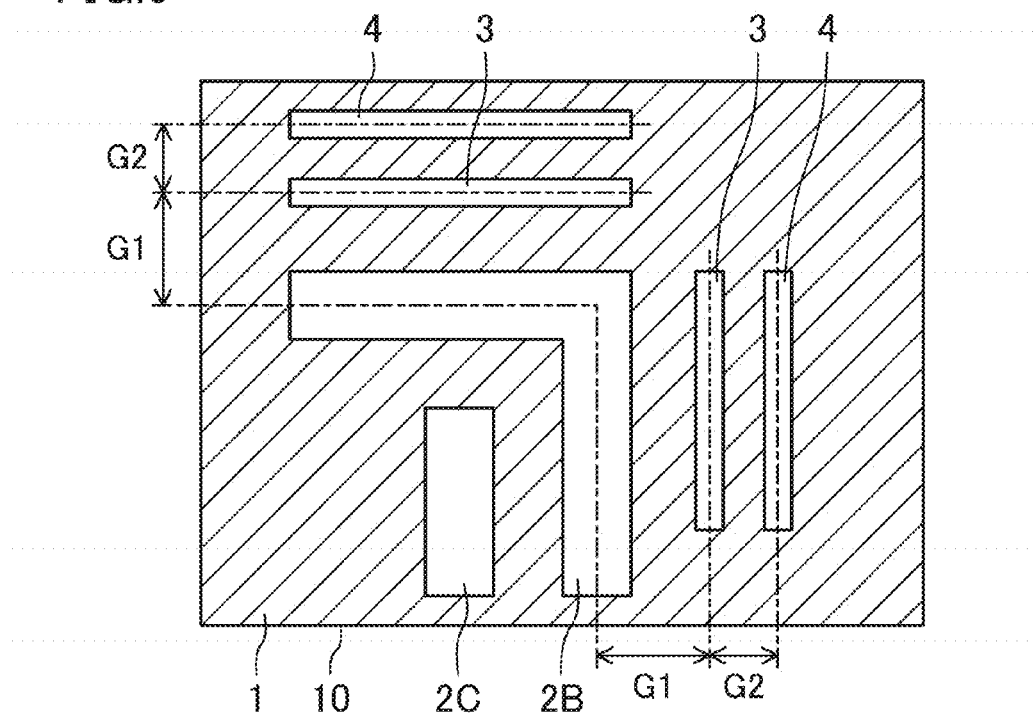
FIG. 9 is a plane view illustrating a photo mask according to a second modified example of the first embodiment.

As illustrated in FIG. 9, a photo mask according to the second modified example includes an L shape first main pattern 2B, a line shape second main pattern 2C provided inside the curvature of the first main pattern 2B, and first auxiliary patterns 3 and second auxiliary patterns 4 provided in two regions outside the curvature of the first main pattern 2B so as to extend in parallel to line shape parts of the main pattern 2B.

The center line of each of the two first auxiliary patterns 3 is located at a distance G1 from a part of the center line of the first main pattern 2B extending in parallel to the first auxiliary pattern 3. The center line of each of the two second auxiliary patterns 4 is located at a distance G2 from a corresponding one of the center lines of the first auxiliary patterns 3 extending in parallel to the second auxiliary pattern 4. The distance G1 is greater than the distance G2.

As described above, it is clear that, whatever shape each of the main patterns 2B and 2C has, the advantages of the present disclosure may be achieved by providing the auxiliary patterns 3 and 4 such that each of the auxiliary patterns 3 and 4 is adjacent to a corresponding one of long sides of the main pattern 2B.

Third Modified Example of First Embodiment

A third modified example of the first embodiment will be described below with reference to FIG. 10A.

Figure 10A:
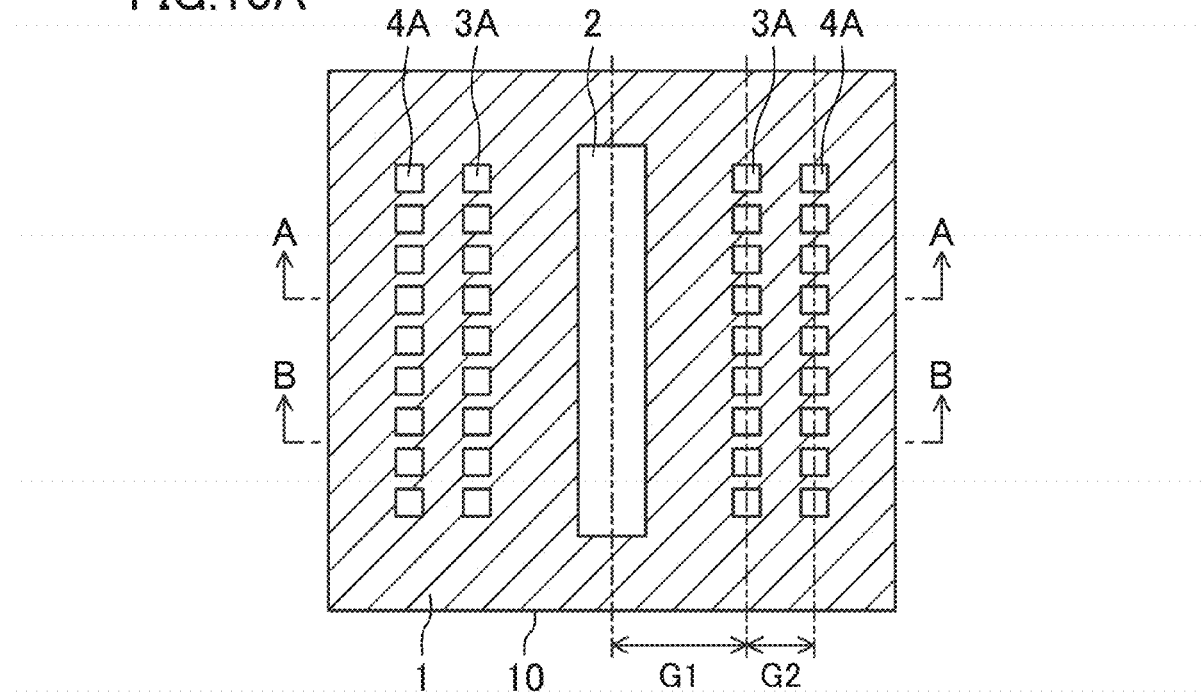
FIG. 10A is a plane view illustrating a photo mask according to a third modified example of the first embodiment.

As illustrated in FIG. 10A, a photo mask according to the third modified example includes a line shape main pattern 2, and first auxiliary patterns 3A and second auxiliary patterns 4A provided at both sides of the main pattern 2 so as to extend in parallel to the main pattern 2.

The center line of each of the first auxiliary patterns 3A is located at a distance G1 from the center line of the main pattern 2 and the center line of each of the second auxiliary patterns 4A is located at a distance G2 from the center line of a corresponding one of the first auxiliary patterns 3A. The distance G1 is greater than the distance G2.

In this case, each of the first auxiliary patterns 3A and the second auxiliary patterns 4A is divided into a plurality of segmented portions in the direction parallel to the main pattern 2. That is, each of the auxiliary patterns 3A and 4A does not have to be a single continuous opening portion having a line shape, and has a structure in which quadrilateral opening portions are provided in a line shape at intervals.

Figure 10B:
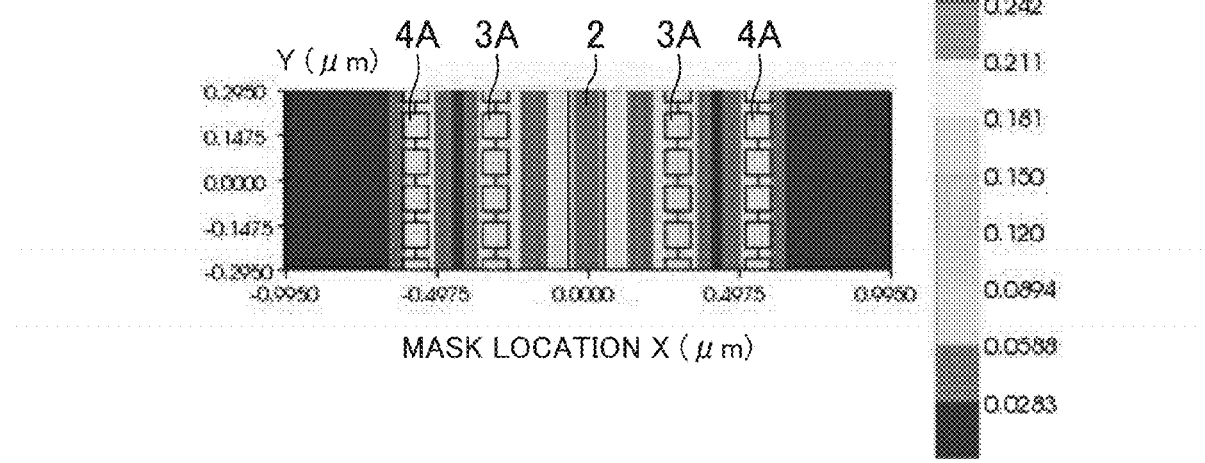
FIG. 10B is a graph illustrating light intensity at the X-Y plane on a resist film of the photo mask according to the third modified example of the first embodiment.

FIG. 10B illustrates light intensity in the X-Y plane on a resist film formed by a photo mask illustrated in FIG. 10A. The condition of the simulation is that oblique-incidence exposure (an annular illumination) is used, NA=0.7, SA=0.7, and λ=248 nm. The width of the main pattern 2 which is an isolated pattern is 120 nm×M and the value of M=4 is used. The distance G1 between the center line of the main pattern 2 and the center line of each of the first auxiliary patterns 3A is 300 nm, and the distance G2 between the center line of the first auxiliary pattern 3A and the center line of a corresponding one of the second auxiliary patterns 4A is 260 nm.

Each of the first auxiliary patterns 3A and the second auxiliary patterns 4A has a square shape with a side of 84 nm, and is provided at a resolution pitch of 120 nm.

In the condition of the simulation according to the third modified example, the depth of focus is 374 nm at both of the line A-A and the line B-B illustrated in FIG. 10A. Note that the A-A line represents a line extending on the first auxiliary patterns 3A and the second auxiliary patterns 4A, and the line B-B represents a line which does not extend on the first auxiliary patterns 3A and the second auxiliary patterns 4A. In this case, assuming that the value of 1/M of the mask dimension is a target transcription dimension, the value of the depth of focus is calculated.

The depth of focus of 374 nm is 37% higher than the value of the depth of focus of a simple isolated pattern to which the present disclosure is not applied, and has the effectiveness of this modified example.

This is because, as illustrated in FIG. 10B, the resolution pitch of squares forming the auxiliary patterns 3A and 4A is set to 120 nm or less, which is small enough, according to this modified example, and thus, non-opening regions between the opening portions in each of the auxiliary patterns 3A and 4A have sufficient light intensity.

Note that, in FIG. 10A, all of the four line shape auxiliary patterns at both sides of the main pattern 2 are provided in a line as a plurality of quadrilateral patterns located at predetermined intervals. However, in this modified example, the auxiliary patterns are not limited the above-described configuration, but only the two auxiliary patterns, i.e., the first auxiliary pattern 3A and the second auxiliary pattern 4A provided at one side, may be provided as two continuous line auxiliary patterns.

As another option, each of the inner two auxiliary patterns, i.e., the first auxiliary patterns 3A, located closer to the main pattern 2 may be divided into a plurality of segmented quadrilateral patterns, and the two outer auxiliary patterns, i.e., the second auxiliary patterns 4A, may be provided as continuous line shape auxiliary patterns.

Furthermore, only at least a single auxiliary pattern may be provided as a plurality of quadrilateral patterns forming a line shape, regardless of where the auxiliary pattern is provided.

As illustrated in FIG. 1, a case where a photo mask according to the first embodiment is configured so that the two auxiliary patterns, i.e., one of the first auxiliary patterns 3 and one of the second auxiliary patterns 4, are provided at each side of the main pattern 2 which is an isolated opening portion has been described. However, the auxiliary patterns 3 and 4 according to this embodiment are not limited to the above-described configuration in which two auxiliary patterns, i.e., one of the first auxiliary patterns 3 and one of the second auxiliary patterns 4, are provided at each side of the main pattern 2. For example, as long as excellent periodicity of light intensity may be achieved for a resist film formed on a semiconductor substrate, three or more auxiliary patterns may be provided in a region located at each side.

Second Embodiment

A photo mask according to a second embodiment will be described below with reference to the accompanying drawings.

Figure 11A:
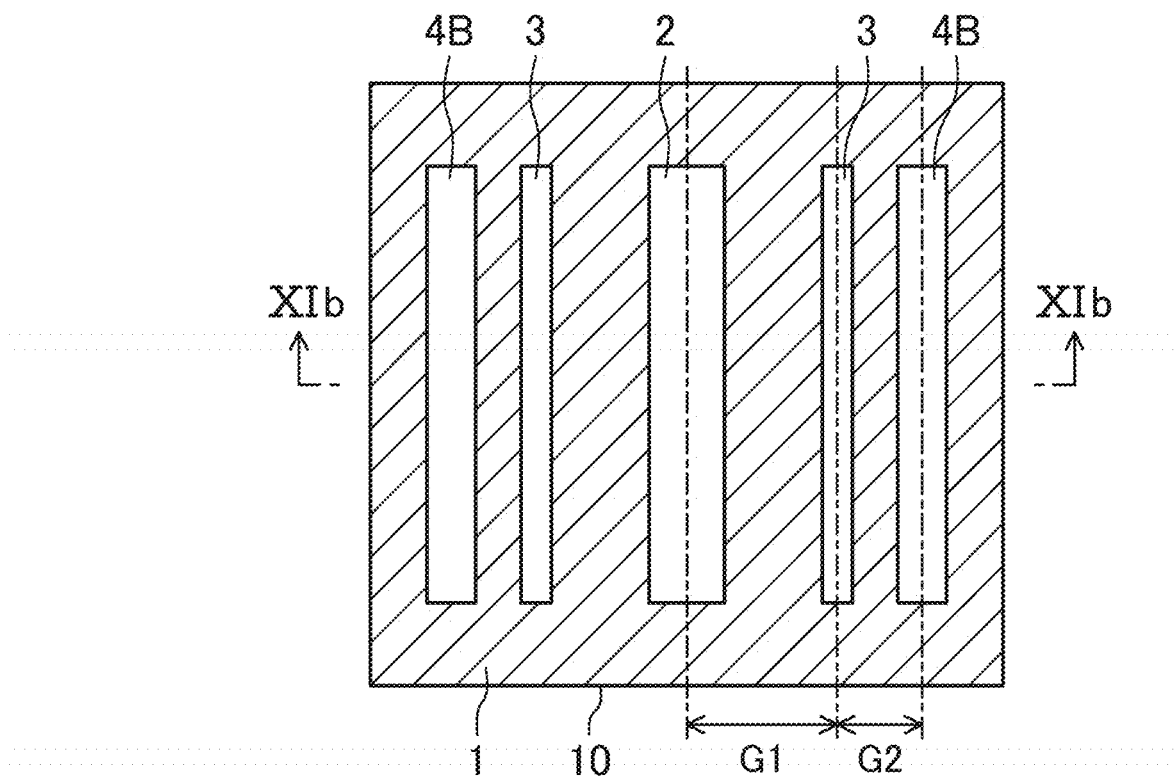
FIG. 11A is a plane view illustrating a photo mask according to a second embodiment.
Figure 11B:
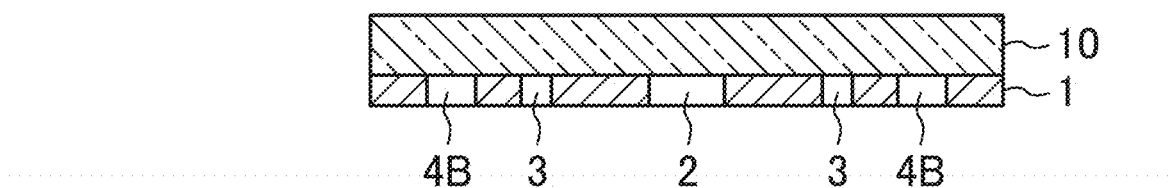
FIG. 11B is a cross-sectional view taken along the line XIb-XIb of FIG. 11A.

FIG. 11A illustrates a planar configuration of a photo mask according to the second embodiment. FIG. 11B illustrates a cross-sectional configuration taken along the line Xb-Xb of FIG. 11A. A case where a resist material that is a target member to be exposed with exposure light transmitted through the photo mask is a positive resist will be described below.

As illustrated in FIG. 11A and FIG. 11B, a light shielding film 1 made of, for example, chromium (Cr) is formed in a glass substrate 10 which serves as a substrate of a photo mask. The light shielding film 1 is selectively removed, and a circuit pattern, i.e., a main pattern 2 which is a line shape isolated opening portion, is formed.

First auxiliary patterns 3 and second auxiliary patterns 4B which are auxiliary opening portions, each being located so as to extend in parallel to the main pattern 2, are provided in parts of the light shielding film 1 located at both sides of the main pattern 2.

Each of the respective widths of the first auxiliary patterns 3 and the second auxiliary patterns 4B is smaller than the width of the main pattern 2. A distance G1 between the center line of the main pattern 2 and the center line of each of the first auxiliary patterns 3 is greater than a distance G2 between the center line of the first auxiliary pattern 3 and the center line of a corresponding one of the second auxiliary patterns 4B. The distances G1 at both sides of the main pattern 2 are equal to one another. The first auxiliary patterns 3 and the second auxiliary patterns 4B are located at locations which cause the distance G2 at the both sides of the main pattern 2 to be equal to one another.

Furthermore, in the second embodiment, the width of the second auxiliary patterns 4B is greater than the width of the first auxiliary patterns 3.

As described above, an opening pattern including the main pattern 2, the first auxiliary patterns 3, and the second auxiliary patterns 4B is formed in the photo mask. Therefore, each of the auxiliary patterns 3 and 4B is located in a proper location, so that exposure light transmitted through the opening portion of the main pattern 2 and exposure light transmitted through each of the opening portions of the first auxiliary patterns 3 and the second auxiliary patterns 4B interfere with one another, and as a result, defocus characteristics are improved.

In this case, the first auxiliary patterns 3 are located in locations closer to the main pattern 2 than the locations of the second auxiliary patterns 4B. Thus, a relatively large bias due to light intensity generated by the exposure light transmitted through the opening portion of the main pattern 2 is added to exposure light transmitted through the first auxiliary patterns 3, as compared to the second auxiliary patterns 4B.

That is, as in the first embodiment, when the width of the first auxiliary patterns 3 and the width of the second auxiliary patterns 4B are the same, the light intensity of the first auxiliary patterns 3 is higher than the light intensity of the second auxiliary patterns 4B.

In contrast, in the second embodiment, defocus characteristics are reliably improved by increasing the width of the second auxiliary patterns 4B such that the light intensity of the second auxiliary patterns 4B is approximately the same as the light intensity of the first auxiliary patterns 3. As a result, the depth of focus is further increased.

Figure 12A:
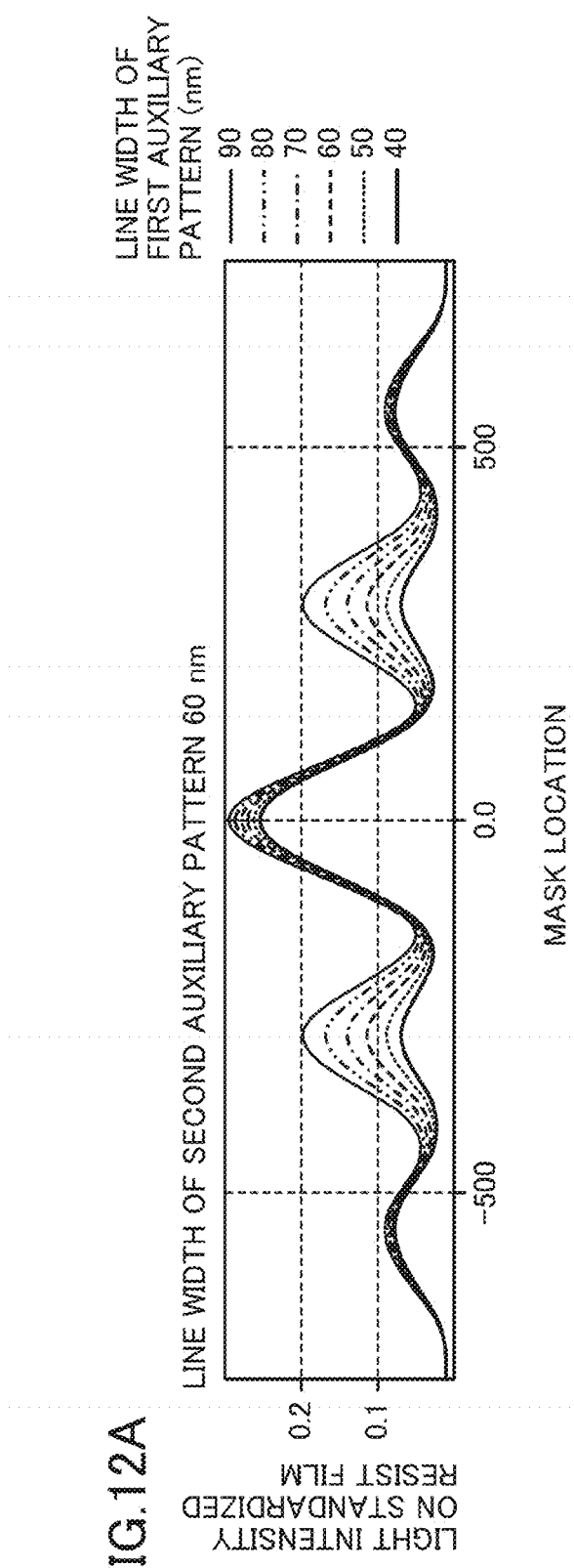
FIG. 12A and FIG. 12B are graphs illustrating results of a simulation of light intensity when the width of the first auxiliary pattern and the width of the second auxiliary pattern are changed and oblique-incidence exposure is performed.
Figure 12B:
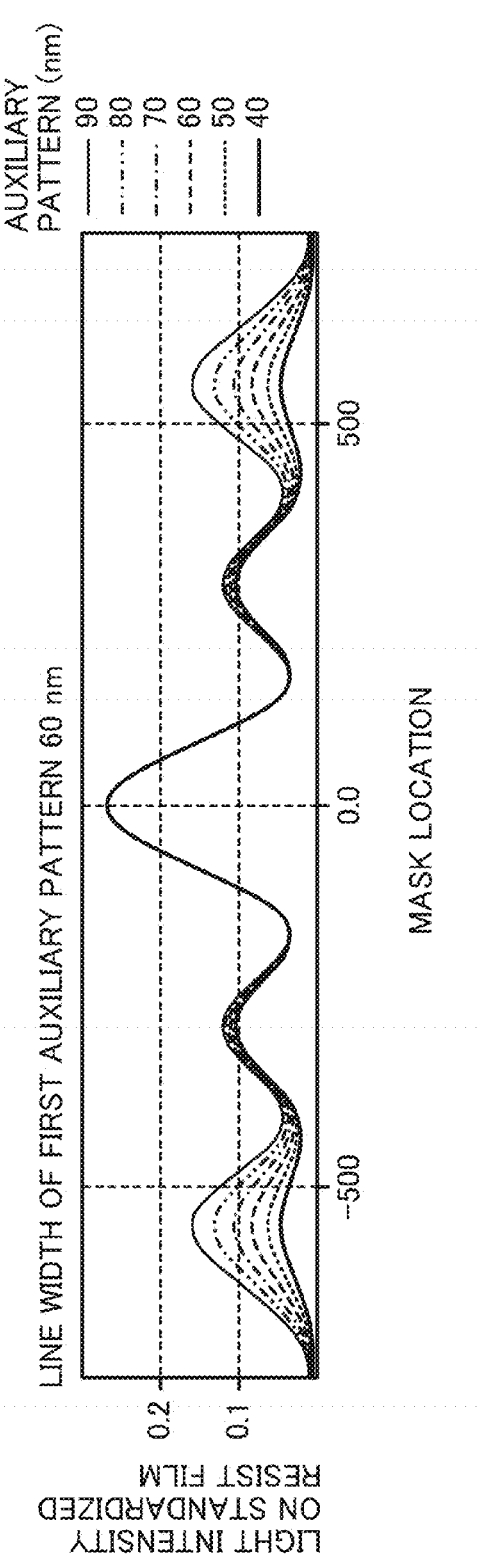

FIG. 12A and FIG. 12B illustrate results of a simulation of light intensity when the width of the first auxiliary patterns 3 and the width of the second auxiliary patterns 4B are changed and oblique-incidence exposure is performed. FIG. 12A illustrates results of calculation for six patterns the width of the first auxiliary patterns 3 of which are increased by 10 nm each time from 40 nm to 90 nm while the width of the second auxiliary patterns 4B is fixed to 60 nm. In contrast, FIG. 12B illustrates results of calculation for six patterns the width of the second auxiliary patterns 4B of which are increased by 10 nm each time from 40 nm to 90 nm while the width of the first auxiliary patterns 3 is fixed to 60 nm.

The condition of the simulation is that oblique-incidence exposure (an annular illumination) is used, NA=0.7, SA=0.7, and λ=248 nm. The width of the main pattern 2 is 120 nm×M and the value of M=4. The distance G1 between the center line of the main pattern 2 and each of the first auxiliary patterns 3 is 300 nm, and the distance G2 between the center line of each of the first auxiliary patterns 3 and the center line of a corresponding one of the second auxiliary patterns 4B is 260 nm. Each of the main pattern 2 and the auxiliary patterns 3 and 4B has a structure in which a light shielding film is stacked on a transparent substrate and opening portions are patterned in the stacked shielding film.

As illustrated in FIG. 12A, when the width of the opening portions of the first auxiliary patterns 3 located in locations closer to the main pattern 2 than the locations of the second auxiliary patterns 4B is increased, the light intensity of the main pattern 2 is increased, and the contrast is increased. At the same time, the phases of light match, and thus, defocus characteristics are improved, resulting in increase in the depth of focus.

In contrast, as illustrated in FIG. 12B, even when the width of the second auxiliary patterns 4B located in locations at a more distance from the main pattern 2 than the first auxiliary patterns 3, the light intensity of the main pattern 2 is not greatly changed. That is, only the advantage of matching the phases of exposure light is achieved, and thus, increase in the depth of focus is less than that when the width of the first auxiliary patterns 3 is increased.

On the basis of the simulation results illustrated in FIG. 12A and FIG. 12B, the width of the first auxiliary patterns 3 is preferably increased within a range which does not cause the first auxiliary patterns 3 to be transcribed onto the resist film.

The light intensity of the second auxiliary patterns 4B is lower than the light intensity of the first auxiliary patterns 3. Therefore, increasing the width of second auxiliary patterns 4B such that the width of the second auxiliary patterns 4B is greater than the width of the first auxiliary patterns 3 within the range which does not cause the second auxiliary patterns 4B to be transcribed onto the resist film, that is, a range which causes the light intensity of light transmitted through the second auxiliary patterns 4B to be approximately the same as the light intensity of the first auxiliary patterns 3 may improve defocus characteristics and greatly increase the depth of focus without causing each of the auxiliary patterns 3 and 4B to be transcribed onto the resist film.

Note that, in the second embodiment, the width of the second auxiliary patterns 4B is preferably 1.5 times the width of the first auxiliary patterns 3 or less. Thus, the probability that each of the auxiliary patterns 3 and 4B is transcribed onto the resist film is reduced, and the advantage of increasing the depth of focus may be reliably achieved.

Also, in the second embodiment, a case where the auxiliary patterns 3 and 4B are provided such that the two auxiliary patterns, i.e., one of the first auxiliary patterns 3 and one of the second auxiliary patterns 4B, are located at each side of the main pattern 2 which is an isolated opening portion has been described. However, the number of the auxiliary patterns is not limited to the above-described case where the auxiliary patterns 3 and 4B are provided such that the two auxiliary patterns, i.e., one of the first auxiliary patterns 3 and one of the second auxiliary patterns 4B, are located at each side of the main pattern 2, but three or more auxiliary patterns may be provided at each side of the main pattern 2. When a line pattern group is provided, two or more auxiliary patterns may be provided so as to be adjacent to each outermost main pattern in the long side direction.

Third Embodiment

A photo mask according to a third embodiment will be described below with reference to the accompanying drawings.

Figure 13A:
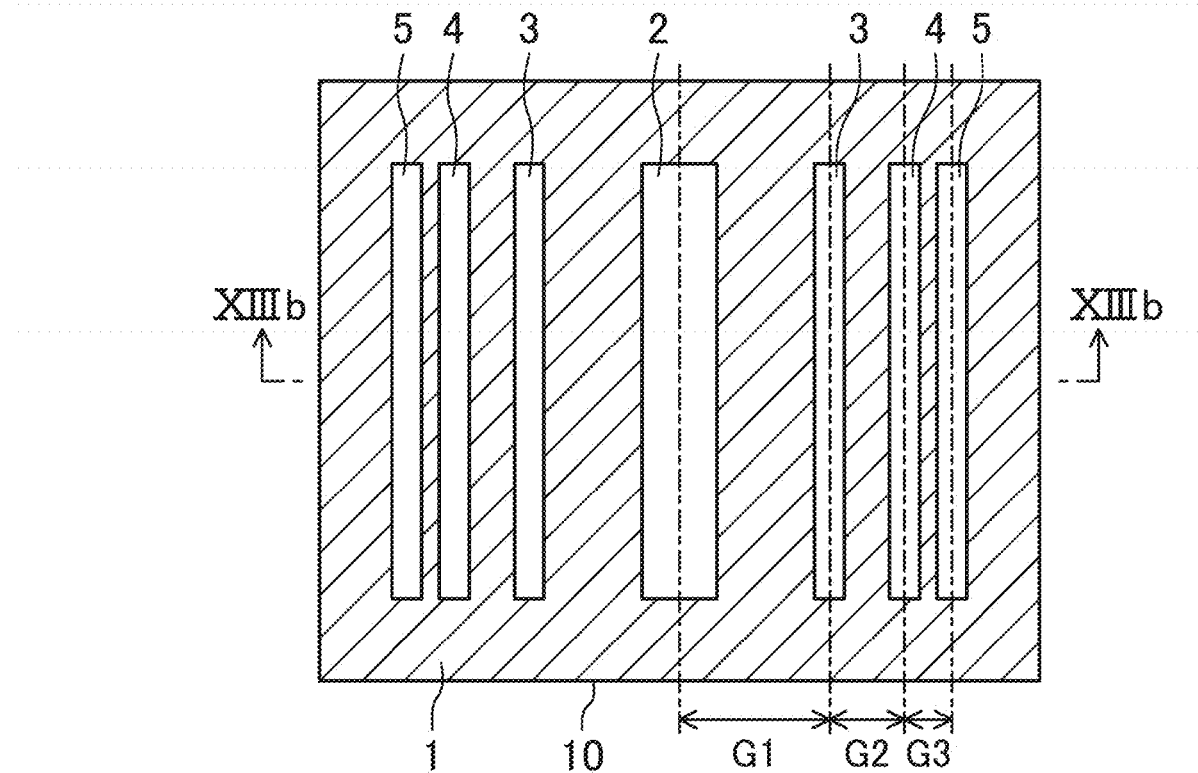
FIG. 13A is a plane view illustrating a photo mask according to a third embodiment.
Figure 13B:
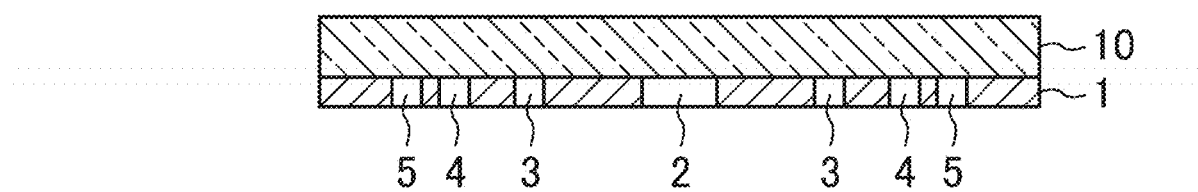
FIG. 13B is a cross-sectional view taken along the line XIIIb-XIIIb of FIG. 13A.

FIG. 13A illustrates a planar configuration of a photo mask according to the third embodiment. FIG. 13B illustrates a cross-sectional configuration taken along the line XIIIb-XIIIb. A case where a resist material that is a target member to be exposed with exposure light transmitted through the photo mask is a positive resist will be described below.

As illustrated in FIG. 13A and FIG. 13B, a light shielding film 1 made of, for example, chromium (Cr) is formed in a glass substrate 10 which serves as a substrate of a photo mask. The light shielding film 1 is selectively removed, and a circuit pattern, i.e., a main pattern 2 which is a line shape isolated opening portion is formed.

First auxiliary patterns 3, second auxiliary patterns 4, and third auxiliary patterns 5 which are auxiliary opening portions, each being located so as to extend in parallel to the main pattern 2, are provided in parts of the light shielding film 1 located at both sides of the main pattern 2.

Each of the respective widths of the first auxiliary patterns 3, the second auxiliary patterns 4, and the third auxiliary patterns 5 is smaller than the width of the main pattern 2. A distance G1 between the center line of the main pattern 2 and the center line of each of the first auxiliary patterns 3 is greater than a distance G2 between the center line of the first auxiliary pattern 3 and the center line of a corresponding one of the second auxiliary patterns 4. Furthermore, the distance G2 is greater than a distance G3 between the center line of each of the second auxiliary patterns 4 and the center line of a corresponding one of the third auxiliary patterns 5.

As described above, in the photo mask, an opening pattern including the main patterns 2, the first auxiliary patterns 3, the second auxiliary patterns 4, and the third auxiliary patterns 5 is formed in the photo mask. Therefore, each of the auxiliary patterns 3, 4, and 5 is located at a proper location, so that exposure light transmitted through the opening portion of the main pattern 2 and exposure light transmitted through the opening portion of each of the first auxiliary patterns 3, 4, and 5 interfere with one another and defocus characteristics are improved. As a result, the depth of focus is increased. As the condition of interference of diffracted light in this case, the distance G3 is preferably 70 nm×M or more and smaller than 2.0×($\lambda$/NA)×M. Thus, interference of diffracted light may be reliably achieved, and also, phase deviation of light may be reduced. Thus, defocus characteristics are improved and the depth of focus is increased.

Figure 14:
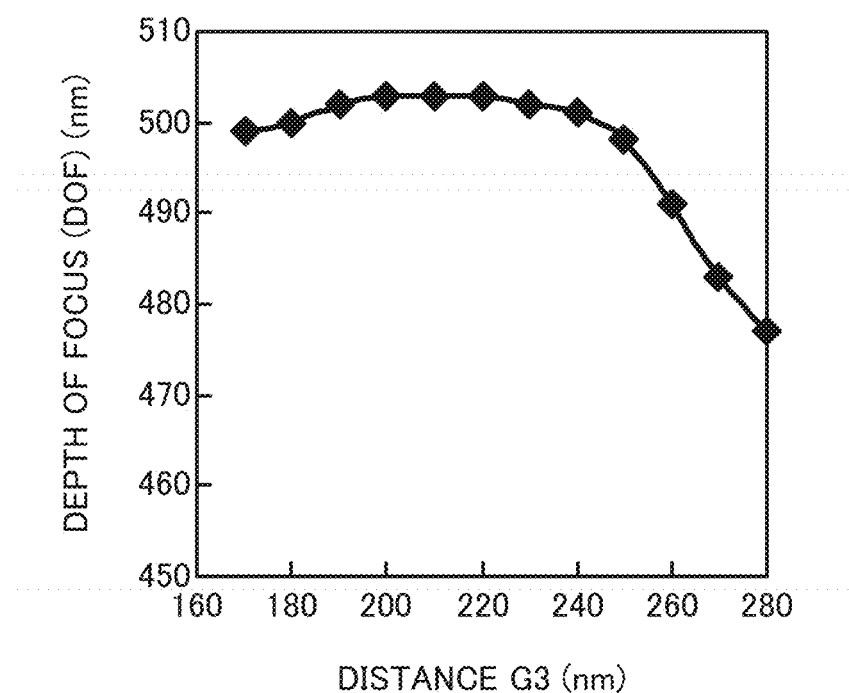
FIG. 14 is a graph illustrating results of a simulation of the depth of focus (DOF) when a distance G3 between the center line of the second auxiliary pattern and the center line of the third auxiliary pattern is changed and oblique-incidence exposure is performed in the photo mask according to the third embodiment.
Figure 16:
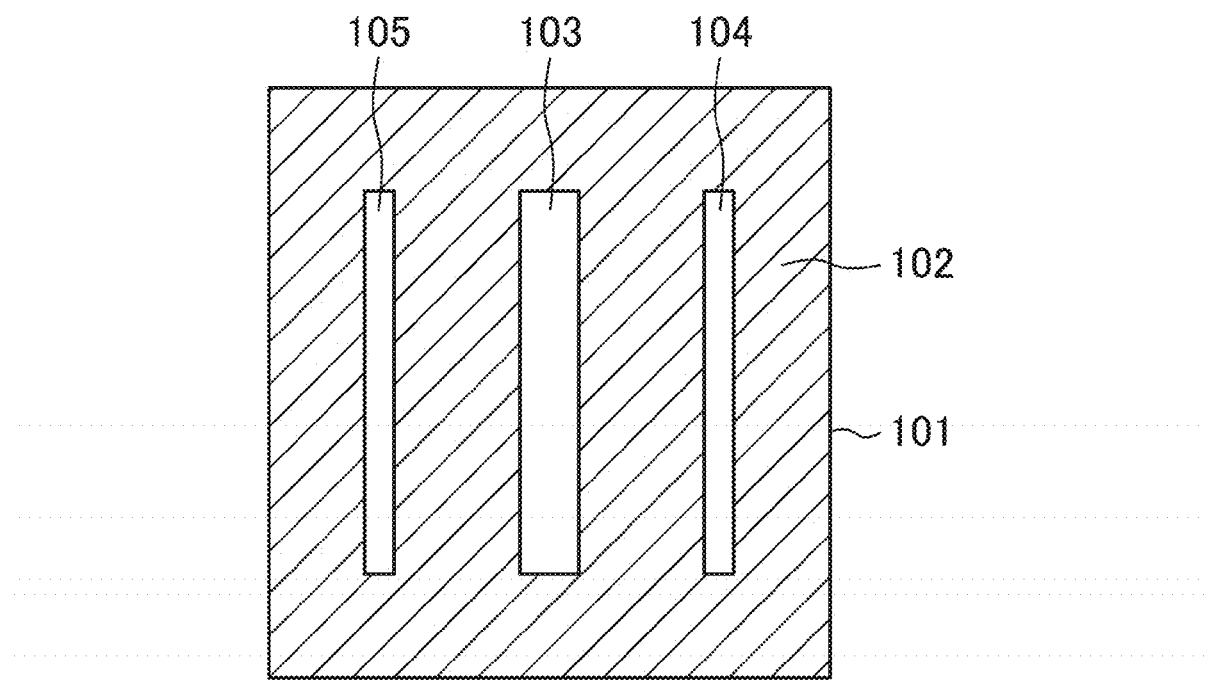
FIG. 16 is a plane view illustrating a photo mask according to a first related art example.
Figure 17:
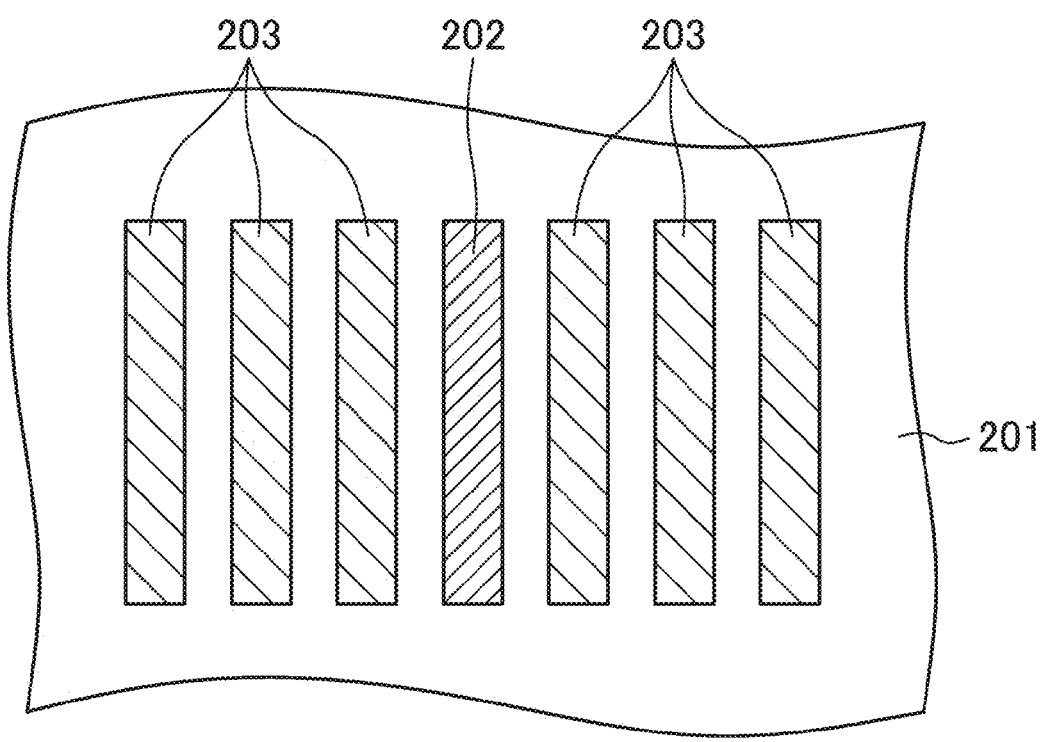
FIG. 17 is a plane view illustrating a photo mask according to a second related art example.

FIG. 14 illustrates results of a simulation of the depth of focus when the distance G3 between the center line of each of the second auxiliary patterns 4 and the center line of a corresponding one of the third auxiliary patterns 5 is changed and oblique-incidence exposure is performed in a photo mask according to the third embodiment. The condition of the simulation is that oblique-incidence exposure (an annular illumination) is used, NA=0.7, SA=0.7, and $\lambda$=248 nm. The width of the main pattern 2 which is an isolated pattern is 120 nm×M and the value of M=4 is used. The distance G1 between the center line of the main pattern 2 and each of the first auxiliary patterns 3 is 300 nm, the distance G2 between the center line of the first auxiliary pattern 3 and the center line of a corresponding one of the second auxiliary patterns 4 is 260 nm. Note that each of the main pattern 2 and the auxiliary patterns 3, 4, and 5 has a structure in which a light shielding film is stacked on a transparent substrate and opening portions are patterned in the stacked shielding film.

As understood from FIG. 14, when the distance G3 between the center line of each of the second auxiliary patterns 4 and a corresponding one of the third auxiliary patterns 5 is smaller than the distance G2 between the center line of each of the first auxiliary patterns 3 and the center line of a corresponding one of the second auxiliary patterns 4, that is, specifically, smaller than 260 nm, exposure light transmitted through the opening portion of the main pattern 2 and exposure light transmitted through the opening portion of each of the auxiliary patterns 3, 4, and 5 interfere with one another, and defocus characteristics are improved. As a result, the advantage of increasing the depth of focus is maximized.

Note that, in the third embodiment, a case where three auxiliary pattern, i.e., one of the first auxiliary patterns 3, one of the second auxiliary patterns 4, and one of the third auxiliary patterns 5, are provided at each side of the main pattern 2 which is an isolated opening portion has been described. However, the number of the auxiliary patterns is not limited to the above-described case where three auxiliary pattern, i.e., one of the first auxiliary patterns 3, one of the second auxiliary patterns 4, and one of the third auxiliary patterns 5 are provided at each side of the main pattern 2, but four or more auxiliary patterns may be provided at each side of the main pattern 2. When a line pattern group is provided, three or more auxiliary patterns may be provided so as to be adjacent to each outermost main pattern in the long side direction.

Needless to say, the main pattern according to each of the above-described embodiments is not limited to an isolated line shape. For example, a main pattern group may be provided.

Needless to say, the locations of the auxiliary patterns according to each of the above-described embodiments are not limited to regions at both sides of a main pattern. When a main pattern group is provided, auxiliary patterns may be provided only at one side of a main pattern located at an end part (the outermost part).

Fabrication Method

An example pattern formation method using, as an example of the above-described embodiments, a photo mask according to the first embodiment and an example method for fabricating a semiconductor device using the same will be described below with reference to FIG. 15A-FIG. 15F.

First, isolation regions (not illustrated) made of shallow trench isolations (STIs), etc. are selectively formed in an upper part of a semiconductor substrate 20 made of, for example, silicon (Si).

Next, as illustrated in FIG. 15A, for example, a silicon dioxide film 21, a polysilicon film 22, and a TEOS film 23 are formed in this order over the semiconductor substrate 20.

Next, as illustrated in FIG. 15B, an antireflection film 24 is formed on the TEOS film 23 by a spin-coating method using a coater. Thereafter, the formed antireflection film 24 is baked.

Next, as illustrated in FIG. 15C, a resist film 25 is formed on the antireflection film 24 by a spin-coating method using a coater. Subsequently, the formed resist film 25 is baked.

Next, a photo mask according to the first embodiment is set in a reduced projection type exposure apparatus. Subsequently, using an alignment pattern formed in the photo mask, the photo mask is superimposed above a predetermined region of the semiconductor substrate 20 serving as an underlying substrate. Then, the resist film 25 is exposed with light via the photo mask. If necessary, the resist film 25 is baked, then. Thereafter, the resist film 25 exposed with light is developed by a developer. Thus, as illustrated in FIG. 15D, a resist pattern 25A in which an opening pattern 25a is formed in a desired location on the resist film 25 is obtained.

Next, as illustrated in FIG. 15E, using the resist pattern 25A, the antireflection film 24, the TEOS film 23, and the polysilicon film 22 are dry etched.

Next, as illustrated in FIG. 15F, the resist pattern 25A and the antireflection film 24 are removed by dry etching, i.e., for example, ashing by oxygen (02) gas and sulfuric acid cleaning.

By the above-described process steps, for example, a semiconductor device using a photo mask according to the first embodiment may be fabricated.

Note that a photo mask used for forming a pattern is not limited to a photo mask according to the first embodiment. That is, needless to say, a photo mask according to each of the modified examples of the first embodiment, a photo mask according to the second embodiment, and a photo mask according to the third embodiment are applicable to the photo mask used for forming a mask.

The present disclosure is useful for an exposure photo mask used in a projection exposure apparatus and a method for forming a pattern, specifically, forming a fine pattern, using the photo mask.

What is claimed is:

1. A photo mask, comprising:
a transparent substrate which transmits exposure light;
a light shielding film formed on the transparent substrate;
a first opening portion formed in the light shielding film;
a first auxiliary opening portion provided in the light shielding film and located adjacent to the first opening portion;
a second auxiliary opening portion provided in the light shielding film and located adjacent to the first auxiliary opening portion at an opposite side to the first opening portion; and
a second opening portion provided in the light shielding film and located adjacent to the first opening portion at an opposite side to the first auxiliary opening portion,
wherein
an opening width of the first opening portion is a width with which a transcription pattern is formed on a target member to be exposed with the transmitted exposure light, and is a dimension of $0.8 \times (\lambda/NA) \times M$ or less (where $\lambda$ is a wavelength of the exposure light, and NA and M are a numerical aperture and a reduction ratio of a reduced projection optical system of an exposure apparatus),
each of the first auxiliary opening portion and the second auxiliary opening portion has an opening width with which the transcription pattern is not formed on the target member to be exposed by the transmitted exposure light, and transmits the exposure light to generate diffracted light, and
a first distance between a center of the first opening portion and a center of the first auxiliary opening portion is greater than a second distance between the center of the first auxiliary opening portion and a center of the second auxiliary opening portion.

2. The photo mask of claim 1, wherein
the first distance is $0.5 \times (\lambda/NA) \times M$ or more and $2.0 \times (\lambda/NA) \times M$ or less (where $\lambda$ is a wavelength of the exposure light, and NA and M are a numerical aperture and a reduction ratio of a reduced projection optical system of an exposure apparatus).

3. The photo mask of claim 1, wherein
the second distance is $70 \text{ nm} \times M$ or more and less than $2.0 \times (\lambda/NA) \times M$ (where $\lambda$ is a wavelength of the exposure light, and NA and M are a numerical aperture and a reduction ratio of a reduced projection optical system of an exposure apparatus).

4. The photo mask of claim 1, wherein
the width of the first auxiliary opening portion is 0.1 times the width of the first opening portion or more and 0.8 times the width of the first opening portion or less.

5. The photo mask of claim 1, wherein
the width of the second auxiliary opening portion is 0.1 times the width of the first opening portion or more and 0.8 times the width of the first opening portion or less.

6. The photo mask of claim 1, wherein
the width of the second auxiliary opening portion is greater than the width of the first auxiliary opening portion.

7. The photo mask of claim 1, wherein
the second distance is smaller than the first distance by at least $20 \text{ nm} \times M$ (where M is a reduction ratio of a reduced projection optical system of an exposure apparatus).

8. The photo mask of claim 1, wherein
assuming a predetermined oblique-incidence location SA (where $0.4 \leq SA \leq 0.8$) in exposure in which exposure light is transmitted, the first distance is $0.5 \times (\lambda/\sin \phi) \times M$ or more and $0.8 \times (\lambda/\sin \phi) \times M$ or less (where $\lambda$ is a wavelength of the exposure light, and NA and M are a numerical aperture and a reduction ratio of a reduced projection optical system of an exposure apparatus) relative to an incidence angle $\phi$ defined by $\sin \phi = NA \times SA$.

9. The photo mask of claim 1, wherein
the width of the second auxiliary opening portion is 1.5 times the width of the first auxiliary opening portion or less.

10. The photo mask of claim 1, wherein
the second opening portion serves as a third auxiliary opening portion,
the photo mask further includes a fourth auxiliary opening portion provided in the light shielding film and located adjacent to the third auxiliary portion at an opposite side to the first opening portion,
a distance between a center of the third auxiliary opening portion and the center of the first opening portion is equal to the first distance, and
a distance between the center of the third auxiliary opening portion and a center of the fourth auxiliary opening portion is equal to the second distance.

11. The photo mask of claim 1, further comprising:
a fifth auxiliary opening portion provided in the light shielding film and located adjacent to the second auxiliary opening portion at an opposite side to the first auxiliary opening portion,
wherein
the fifth auxiliary opening portion has an opening width with which a transcription pattern is not formed on the target member to be exposed by the transmitted exposure light and transmits the exposure light to generate diffracted light, and
a third distance between the center of the second auxiliary opening portion and a center of a fifth auxiliary opening portion is smaller than the second distance.

12. The photo mask of claim 11, wherein
the third distance is 70 nm×M or more and less than $2.0 \times (\lambda/NA) \times M$ (where $\lambda$ is a wavelength of the exposure light, and NA and M are a numerical aperture and a reduction ratio of a reduced projection optical system of an exposure apparatus).

13. The photo mask of claim 1, wherein
at least one of the first auxiliary opening portion and the second auxiliary opening portion is divided into a plurality of segmented portions.

14. The photo mask of claim 10, wherein
at least one of the third auxiliary opening portion and the fourth auxiliary opening portion is divided into a plurality of segmented portions.

15. The photo mask of claim 1, wherein
the width of the first auxiliary opening portion and the width of the second auxiliary opening portion are equal to one another.

16. A method for forming a pattern using the photo mask of claim 1, the method comprising:
forming a resist film on a substrate;
irradiating the resist film with the exposure light via the photo mask; and
developing the resist film which has been irradiated with the exposure light to form a resist pattern.

* * * * *